(12) United States Patent
Cui et al.

(10) Patent No.: US 10,393,821 B2
(45) Date of Patent: Aug. 27, 2019

(54) POWER SUPPLY MONITORING SYSTEM USING OPTICAL ESTIMATION

(71) Applicant: Amazon Technologies, Inc., Seattle, WA (US)

(72) Inventors: Chengwu Cui, Redmond, WA (US); Benjamin Martin Schweitzer, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 157 days.

(21) Appl. No.: 15/472,639

(22) Filed: Mar. 29, 2017

(65) Prior Publication Data
US 2018/0284197 A1 Oct. 4, 2018

(51) Int. Cl.
*G01R 31/392* (2019.01)
*G01R 31/382* (2019.01)
(Continued)

(52) U.S. Cl.
CPC ............ *G01R 31/392* (2019.01); *B60L 50/66* (2019.02); *B60L 58/12* (2019.02); *B60L 58/16* (2019.02); *B60L 58/21* (2019.02); *B60L 58/22* (2019.02); *G01B 11/0608* (2013.01); *G01R 31/382* (2019.01); *G06T 7/70* (2017.01); *H01M 10/482* (2013.01); *H01M 10/486* (2013.01); *H04N 7/183* (2013.01); *B60L 2240/545* (2013.01); *G06T 2207/30204* (2013.01); *H01M 2/1077* (2013.01); *H01M 2220/20* (2013.01);

(Continued)

(58) Field of Classification Search
CPC ............ G01B 11/0608; G01R 31/3606; G01R 31/3679; B60L 11/1857; B60L 11/1861; B60L 11/1864; H01M 10/482; H01M 2220/20
See application file for complete search history.

(56) References Cited

U.S. PATENT DOCUMENTS 5,949,219 A 9/1999 Weiss
8,190,383 B2 * 5/2012 Chen ................... G06F 17/5009
702/63

(Continued)

FOREIGN PATENT DOCUMENTS

EP 2937928 A1 10/2015

OTHER PUBLICATIONS

International Search Report and Written Opinion for PCT Application No. PCT/US2018/023419, dated Jun. 1, 2018.

*Primary Examiner* — Elias Desta
(74) *Attorney, Agent, or Firm* — Athorus, PLLC

(57) ABSTRACT

Systems and corresponding methods for optical monitoring of a state of charge or a state of health of a battery are described. For example, the battery monitoring system may include an imaging device that captures images of cells of the battery and determines states of charge of the cells based on observed dimensional changes over time, e.g., relative to reference markers. The observed dimensional changes may also be corrected for dimensional changes due to thermal strain. In addition, states of health of individual cells of the battery may be determined by comparing the dimensional changes of each of the cells over time. Further, the images may be captured at various frequencies, e.g., based on an expected operational duration of the battery and/or based on a current state of charge or state of health.

17 Claims, 10 Drawing Sheets

(51) Int. Cl.
*G06T 7/70* (2017.01)
*G01B 11/06* (2006.01)
*H04N 7/18* (2006.01)
*H01M 10/48* (2006.01)
*B60L 58/16* (2019.01)
*B60L 58/12* (2019.01)
*B60L 58/21* (2019.01)
*B60L 58/22* (2019.01)
*B60L 50/60* (2019.01)
*H01M 2/10* (2006.01)

(52) U.S. Cl.
CPC ........ *Y02T 10/7005* (2013.01); *Y02T 10/7044* (2013.01); *Y02T 10/7061* (2013.01)

(56) References Cited

U.S. PATENT DOCUMENTS 9,843,070 B2 * 12/2017 Dai .................... H01M 10/054
2013/0196235 A1 * 8/2013 Prieto ................ H01M 4/0402
429/315

* cited by examiner

POWER SUPPLY MONITORING SYSTEM USING OPTICAL ESTIMATION

BACKGROUND

Batteries are increasingly used in vehicles, such as electric automobiles and aerial vehicles, including autonomous or unmanned aerial vehicles. When a battery is used as a primary power source for a vehicle, it is desirable to understand the state of charge of the battery to avoid unexpectedly losing power and control of the vehicle. Existing systems for measuring a state of charge of a battery may add additional components, weight, and complexity to a vehicle. Accordingly, it is desirable to be able to monitor a state of charge of a battery with minimal increase in components, weight, and complexity.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

Figure 1:
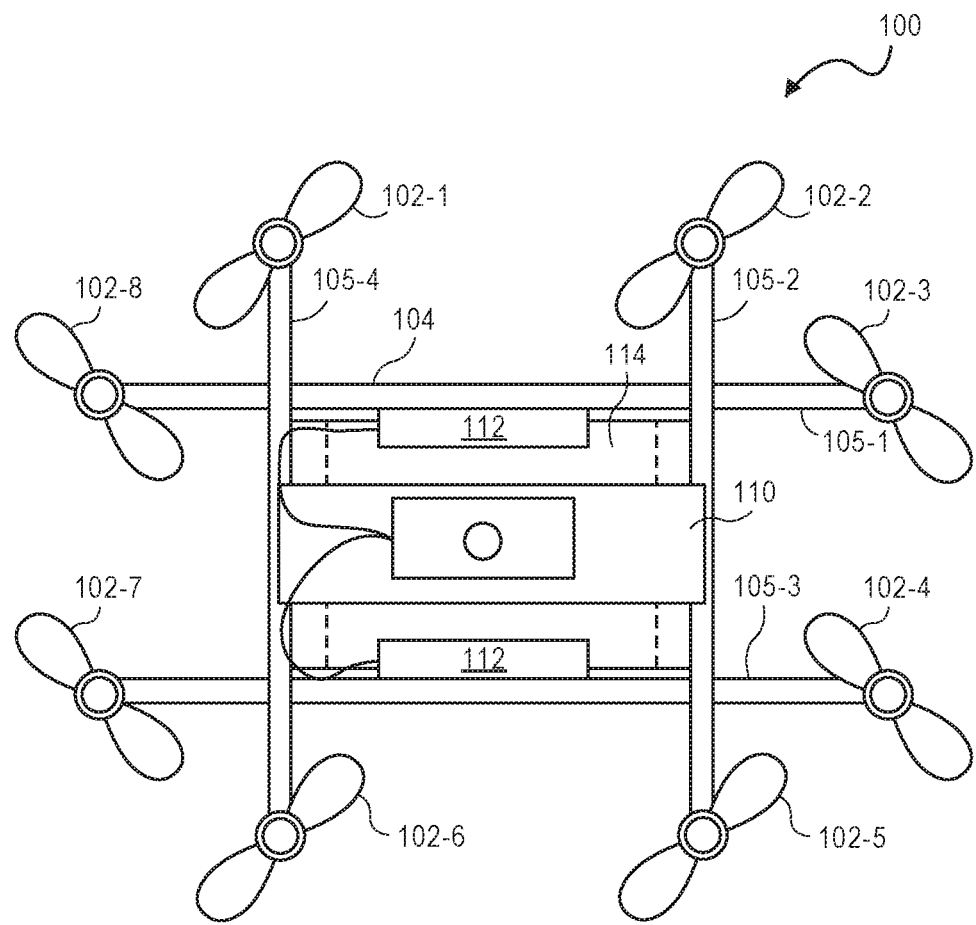
FIG. 1 is a schematic diagram of a top-down view of an aerial vehicle, according to an implementation.

While implementations are described herein by way of example, those skilled in the art will recognize that the implementations are not limited to the examples or drawings described. It should be understood that the drawings and detailed description thereto are not intended to limit implementations to the particular form disclosed but, on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

This disclosure describes power supply monitoring systems and corresponding methods for monitoring a state of charge and/or a state of health of a power supply. For example, the power supply, e.g., a battery including one or more stacked electrochemical cells, may be a component of an aerial vehicle. The battery may be positioned within a receptacle or housing, and the housing may include one or more reference markers that are each aligned with a corresponding electrochemical cell of the battery, e.g., an edge of a corresponding electrochemical cell. The monitoring system may include an imaging device that captures images of the stacked electrochemical cells and corresponding reference markers. The edges of the stacked electrochemical cells and corresponding reference markers may be recognized using image recognition techniques. Based at least in part on the recognized edges and reference markers within the captured images, a dimension, e.g., a physical size, and/or a dimensional change, e.g., an increase or decrease in physical size, of one or more electrochemical cells may be determined using distance estimation techniques. The determined dimensions and/or dimensional changes may be used to estimate a state of charge and/or a state of health of one or more electrochemical cells of the battery.

In some embodiments, the monitoring system may also include a light source to facilitate the capture of images of the electrochemical cells and corresponding reference markers by the imaging device. For example, the light source may be a separate component from the imaging device or may form part of the imaging device. The light source may provide light in the visible spectrum, infrared spectrum, other wavelengths of light, or combinations thereof. Alternatively or in addition, the housing may include one or more openings or transparent/translucent surfaces to allow natural, ambient, or external light from the environment of the housing to enter and facilitate the capture of images.

In other embodiments, in addition to or in place of the one or more reference markers on the housing, one or more strain gauges may be used to determine a dimensional change of one or more electrochemical cells of the battery. For example, the stacked electrochemical cells may be held in position within the housing by one or more retainers, e.g., bands, straps, clamps, etc., that apply a target pressure to the cells for electrical conductivity therebetween. The retainers may be compliant to allow expansion and contraction of the cells during charging and discharging while substantially maintaining the target pressure applied to the cells. One or more strain gauges may be located on the retainers to measure a dimensional change of the retainers, and thereby a dimensional change of the cells. In addition or alternatively, one or more strain gauges may be applied to each electrochemical cell in order to measure a dimensional change of each cell. The measured dimensional changes may be used to estimate a state of charge and/or a state of health of one or more electrochemical cells of the battery.

Further, the monitoring system may determine a portion of a dimensional change of the one or more electrochemical cells that is due to a change in temperature, e.g., a thermal strain. For example, the monitoring system may include a temperature sensor associated with one or more of the electrochemical cells. A temperature may be measured and associated with a captured image or a strain gauge measurement of the one or more cells, and a dimensional change due to the temperature or a change in the temperature may be determined. In addition or alternatively, the imaging device and/or the light source may utilize infrared light, in which case a temperature associated with a captured image may be determined from infrared or thermal imaging data of the captured image. Then, the determined dimensions and/or dimensional changes of the one or more cells may be corrected to compensate for the thermal strain.

A state of charge of an electrochemical cell of a battery may generally refer to a level of charge, e.g., between 0% (no charge) and 100% (full charge), for the electrochemical cell. In some embodiments, a state of charge of an electrochemical cell may be determined from a determined dimension of the cell, e.g., by at least referencing a known dimension of the cell at a known state of charge. In addition, a state of charge of the electrochemical call may be determined from a change in dimension of the cell over time, e.g., by at least referencing a known rate of change in dimension of the cell over time. For example, a dimensional change of approximately 2-3% of the overall dimension of a power supply (or individual cells of the power supply) may be observed between a full state of charge and a zero state of charge. In addition, the dimensional change may increase or decrease approximately linearly with the state of charge. In some embodiments, a power supply may exhibit greater or lesser than approximately 2-3% dimensional change to an overall dimension of a power supply (or individual cells of the power supply).

A state of health of an electrochemical cell may generally refer to a condition of the cell relative to its ideal specifications, e.g., between 0% (does not meet any of its ideal specifications) and 100% (fully meets all of its ideal specifications). The state of health may include one or more parameters such as capacity, resistance, impedance, conductance, voltage, and others. In some embodiments, a state of health of the electrochemical cell may be determined from a comparison between the changes in dimension of the cell over time and respective changes in dimension of other similar cells over time and/or known changes in dimension of other similar cells having ideal specifications. For example, a cell that exhibits greater changes in physical dimension during charging and/or discharging relative to respective changes in physical dimension of other similar cells may be determined to have a lower state of health, e.g., a reduced capacity.

In further embodiments, the monitoring system may capture images or receive strain gauge measurements at a determined frequency, e.g., every 5-10 seconds or other frequency. The determined frequency may be based on an expected operational duration of the battery, e.g., 30 minutes. In addition or alternatively, the monitoring system may capture images or receive strain gauge measurements at varying frequencies. For example, the monitoring system may capture images or receive data at a first determined frequency, and upon the state of charge of the battery reaching or crossing a determined threshold, the monitoring system may capture images or receive data at a second determined frequency. More specifically, if the battery is being discharged and has crossed a threshold of 20% state of charge, the monitoring system may increase the frequency at which images are captured or data is received. Likewise, if the battery is being charged and has crossed the threshold of 20% state of charge, the monitoring system may decrease the frequency at which images are captured or data is received. Other thresholds, numbers of thresholds, and associated increases or decreases in monitoring frequency can also be implemented with the monitoring systems and methods described herein.

FIG. 1 illustrates a schematic diagram of a top-down view of an aerial vehicle 100, according to an implementation. As illustrated, the aerial vehicle 100 includes eight propellers 102-1, 102-2, 102-3, 102-4, 102-5, 102-6, 102-7, 102-8 spaced about the frame 104 of the aerial vehicle. The propellers 102 may be any form of propeller (e.g., graphite, carbon fiber) and of a size sufficient to lift the aerial vehicle 100 and any inventory engaged by the aerial vehicle 100 so that the aerial vehicle 100 can navigate through the air, for example, to deliver an item to a delivery location. While this example includes eight propellers, in other implementations, more or fewer propellers may be utilized. Likewise, in some implementations, the propellers may be positioned at different locations on the aerial vehicle 100. In addition, alternative methods of propulsion may be utilized. For example, fans, jets, turbojets, turbo fans, jet engines, electric jets, and the like may be used to propel the aerial vehicle.

The frame 104 or body of the aerial vehicle 100 may likewise be of any suitable material, such as graphite, carbon fiber and/or aluminum. In this example, the frame 104 of the aerial vehicle 100 includes four rigid members 105-1, 105-2, 105-3, 105-4, or beams arranged in a hash pattern with the rigid members intersecting and joined at approximately perpendicular angles. In this example, rigid members 105-1 and 105-3 are arranged parallel to one another and are approximately the same length. Rigid members 105-2 and 105-4 are arranged parallel to one another, yet perpendicular to rigid members 105-1 and 105-3. Rigid members 105-2 and 105-4 are approximately the same length. In some embodiments, all of the rigid members 105 may be of approximately the same length, while in other implementations some or all of the rigid members may be of different lengths. Likewise, the spacing between the two sets of rigid members may be approximately the same or different.

While the implementation illustrated in FIG. 1 includes four rigid members 105 that are joined to form the frame 104, in other implementations, there may be fewer or more components to the frame 104. For example, rather than four rigid members, in other implementations, the frame 104 of the aerial vehicle 100 may be configured to include six rigid members. In such an example, two of the rigid members 105-2, 105-4 may be positioned parallel to one another. Rigid members 105-1, 105-3 and two additional rigid members on either side of rigid members 105-1, 105-3 may all be positioned parallel to one another and perpendicular to rigid members 105-2, 105-4. With additional rigid members, additional cavities with rigid members on all four sides may be formed by the frame 104. A cavity within the frame 104 may be configured to include one or more components, e.g., an inventory engagement mechanism for the engagement, transport and delivery of item(s) and/or containers that contain item(s).

In some implementations, the aerial vehicle may be configured for aerodynamics. For example, an aerodynamic housing may be included on the aerial vehicle that encloses the aerial vehicle control system 110, one or more of the rigid members 105, the frame 104 and/or other components of the aerial vehicle 100. The housing may be made of any suitable material(s), such as graphite, carbon fiber, aluminum, etc. Likewise, in some implementations, the location and/or the shape of the inventory (e.g., item or container) may be aerodynamically designed. For example, in some implementations, the inventory engagement mechanism may be configured such that, when the inventory is engaged, it is enclosed within the frame and/or housing of the aerial vehicle 100 so that no additional drag is created during transport of the inventory by the aerial vehicle 100. In other implementations, the inventory may be shaped to reduce drag and provide a more aerodynamic design of the aerial vehicle and the inventory. For example, if the inventory is a container and a portion of the container extends below the aerial vehicle when engaged, the exposed portion of the container may have a curved shape.

The propellers 102 and corresponding propeller motors are positioned at both ends of each rigid member 105. The rigid members 105 to which a propeller motor is mounted is also referred to herein as a motor arm. The propeller motors may be any form of motor capable of generating enough speed with the propellers to lift the aerial vehicle 100 and any engaged inventory, thereby enabling aerial transport of the inventory. For example, the propeller motors may each be a FX-4006-13 740 kv multi rotor motor. The propellers may be of any size and material sufficient to lift the aerial vehicle 100 and any engaged payload. In some implementations, the propellers may be formed of a conductive material, such as carbon fiber, aluminum, graphite, silver, copper, steel, etc.

Mounted to the frame 104 is the aerial vehicle control system 110. In this example, the aerial vehicle control system 110 is mounted in the middle and on top of the frame 104. The aerial vehicle control system 110, as discussed in further detail below with respect to FIG. 8, controls the operation, routing, navigation, communication, and power supply monitoring, as well as the inventory engagement mechanism, of the aerial vehicle 100.

Likewise, the aerial vehicle 100 includes one or more power supplies or modules 112. In this example, the aerial vehicle 100 includes two power supplies 112 that are removably mounted to the frame 104. The power supply for the aerial vehicle may be in the form of battery power, solar power, gas power, super capacitor, fuel cell, alternative power generation source, or a combination thereof. For example, the power supplies 112 may each be a 6000 mAh lithium-ion polymer battery, polymer lithium ion (Li-poly, Li-Pol, LiPo, LIP, PLI or Lip) battery. The power supplies 112 are coupled to and provide power for the aerial vehicle control system 110 the propeller motors, and other components.

In some implementations, one or more of the power modules may be configured such that it can be autonomously removed and/or replaced with another power module while the aerial vehicle is landed. For example, when the aerial vehicle lands at a delivery location, relay location and/or materials handling facility, the aerial vehicle may engage with a charging member at the location that will recharge and/or replace the power module.

As mentioned above, the aerial vehicle 100 may also include an inventory engagement mechanism 114. The inventory engagement mechanism may be configured to engage and disengage items and/or containers that hold items. In this example, the inventory engagement mechanism 114 is positioned within a cavity of the frame 104 that is formed by the intersections of the rigid members 105. The inventory engagement mechanism may be positioned beneath the aerial vehicle control system 110. In implementations with additional rigid members, the aerial vehicle may include additional inventory engagement mechanisms and/or the inventory engagement mechanism 114 may be positioned in a different cavity within the frame 104. The inventory engagement mechanism may be of any size sufficient to securely engage and disengage containers that contain inventory. In other implementations, the engagement mechanism may operate as the container, containing the inventory item(s) to be delivered. The inventory engagement mechanism may communicate with (via wired or wireless communication) and be controlled by the aerial vehicle control system 110.

While the implementations of the aerial vehicle discussed herein utilize propellers to achieve and maintain flight, in other implementations, the aerial vehicle may be configured in other manners. For example, the aerial vehicle may include fixed wings, propellers and fixed wings, other propulsion mechanisms, and/or combinations thereof. In addition, the aerial vehicle may utilize one or more propulsion mechanisms to enable takeoff and landing, and a fixed wing configuration or a combination wing and propulsion mechanism configuration to sustain flight while the aerial vehicle is airborne.

Further, while an aerial vehicle 100 is described herein as an example vehicle that may utilize the power supply monitoring systems and methods described herein to monitor the power supplies 112 that act as a power source for its propulsion mechanisms, control system 110, and other components, the power supply monitoring systems and methods described herein may be utilized to monitor power supplies of any other form of vehicle, e.g., aerial vehicle, land-based vehicle, water-based vehicle, or others. In addition, the power supply monitoring systems and methods described herein may be used in any other system, machine, apparatus, instrument, device, or object having one or more power supplies that may be monitored.

Figure 2:
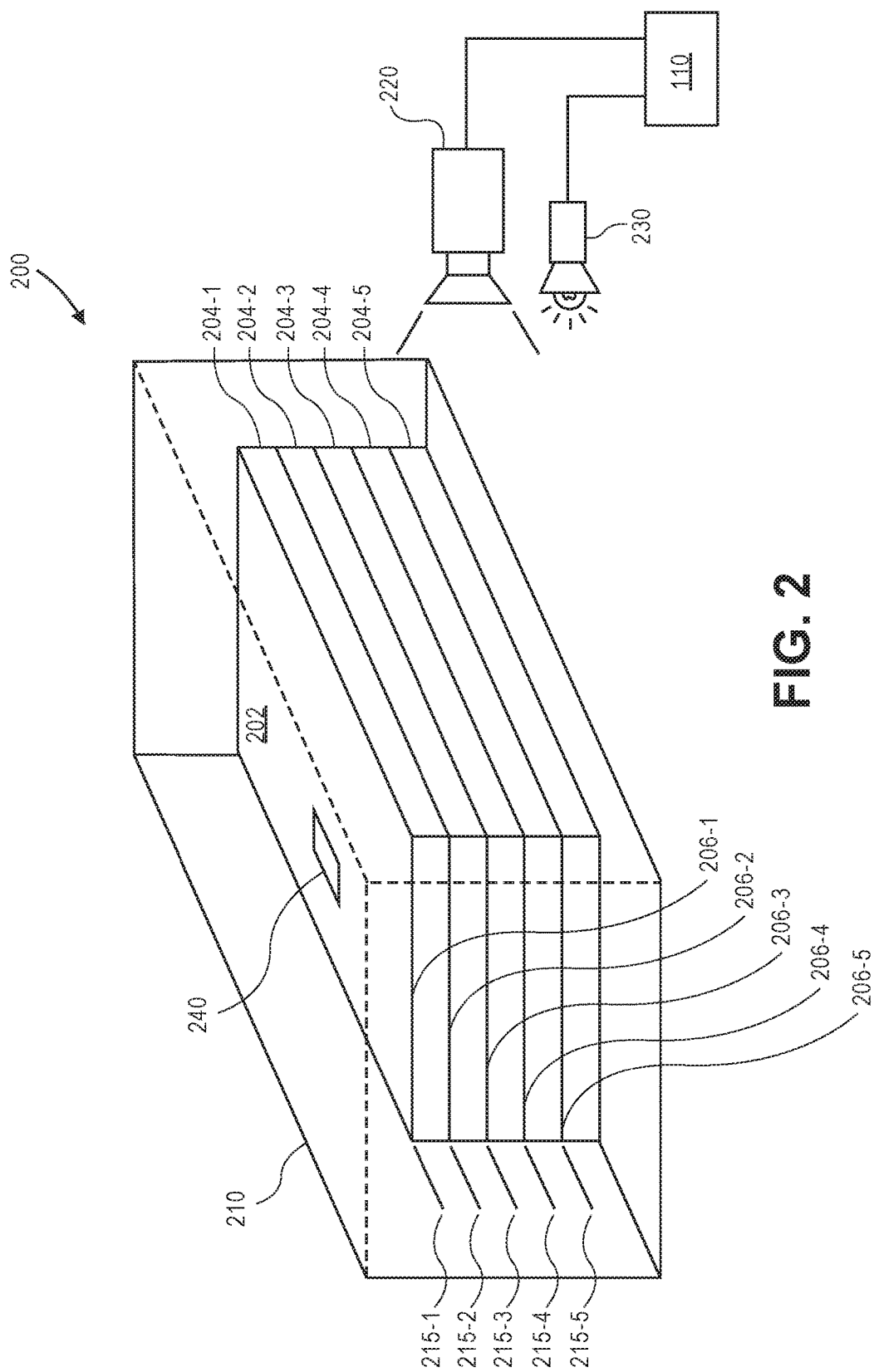
FIG. 2 is a schematic diagram of a power supply monitoring system, according to an implementation.
Figure 3:
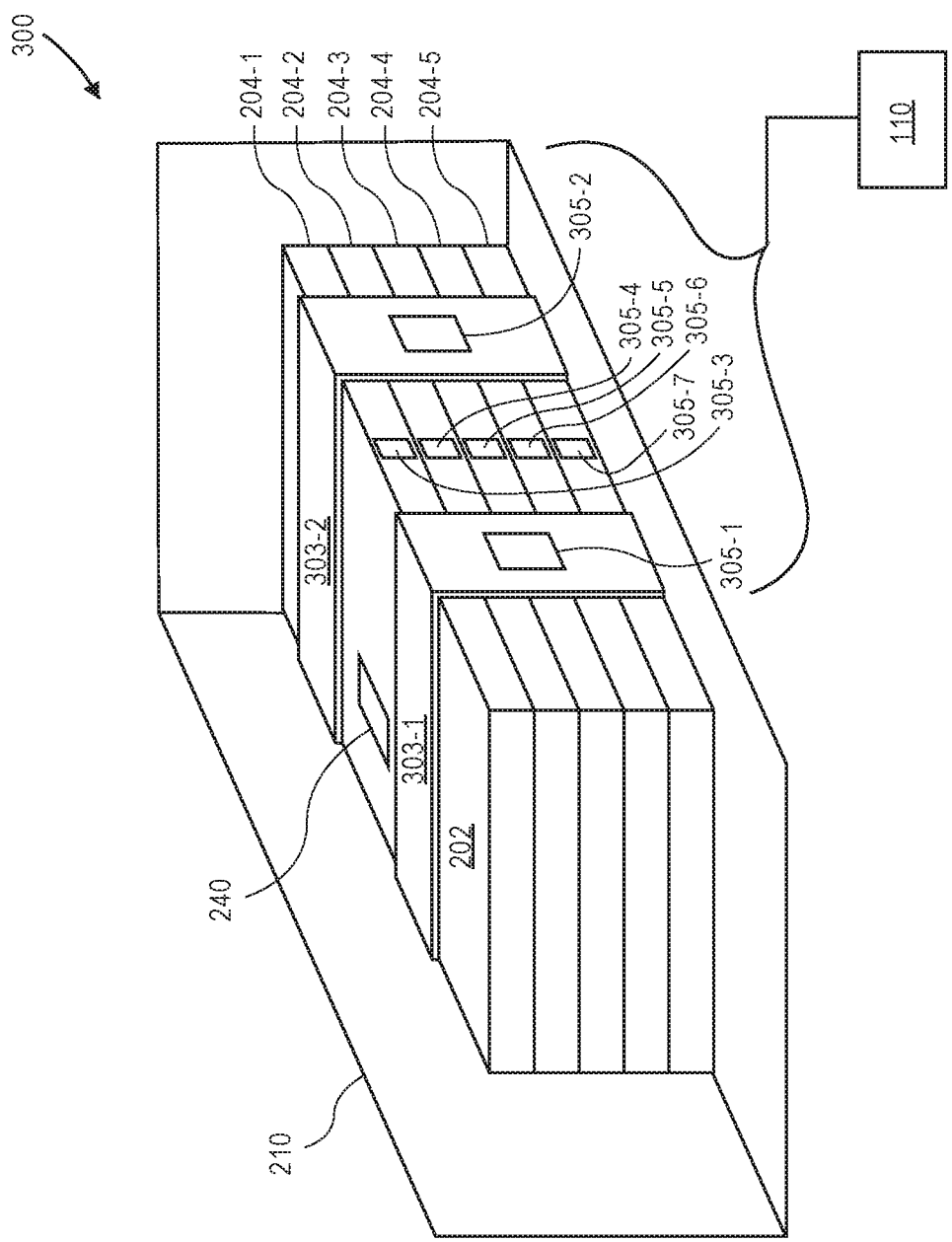
FIG. 3 is a schematic diagram of another power supply monitoring system, according to an implementation.
Figure 4:
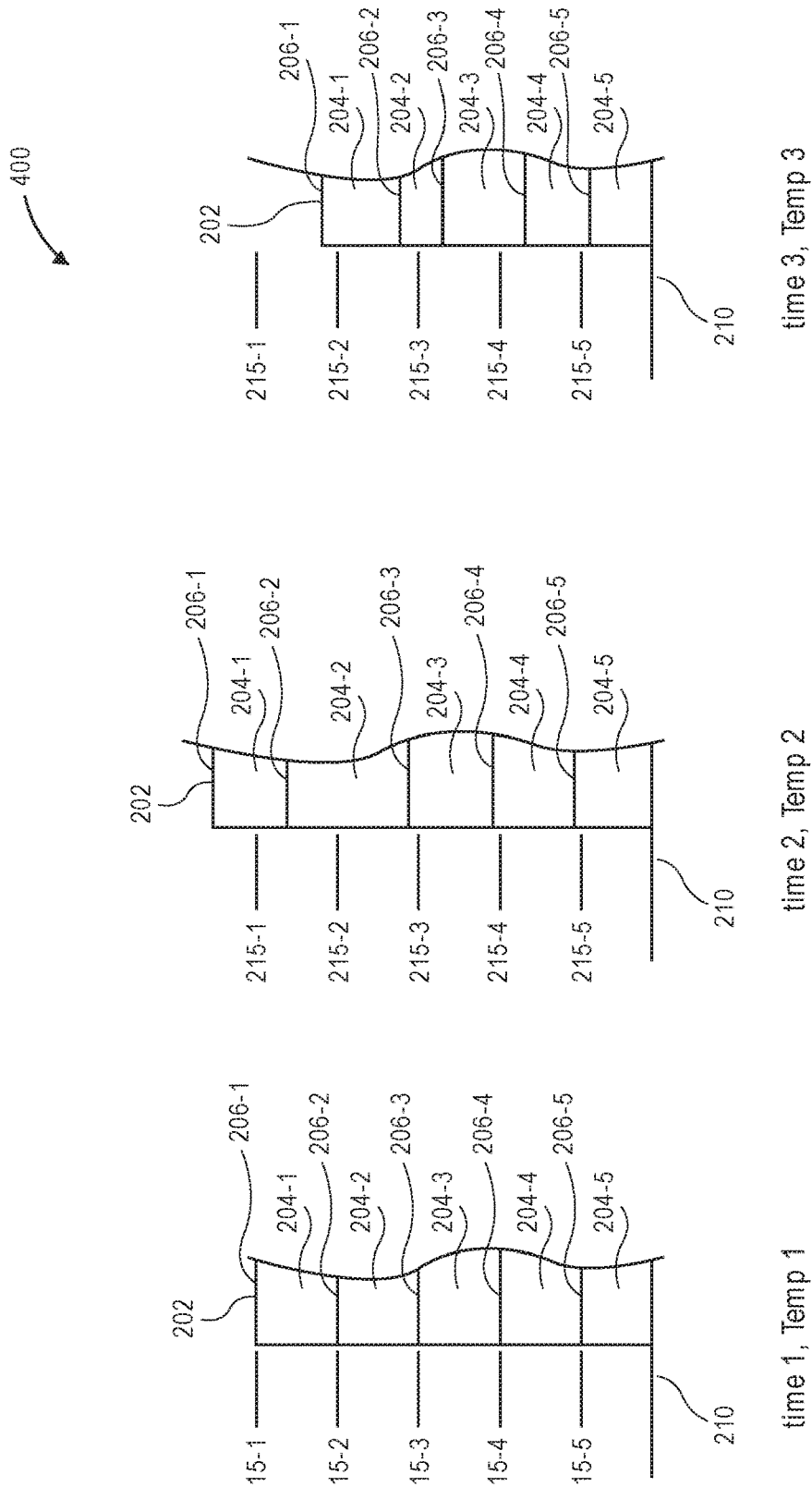
FIG. 4 is a schematic diagram of a sequence of states of charge of a battery, according to an implementation.

FIG. 2 is a schematic diagram of a power supply monitoring system 200, according to an implementation. The monitoring system 200 may utilize optical estimation techniques as described herein in order to determine a state of charge and/or a state of health of a power supply. The monitoring system 200 may include a power supply 202, e.g., a battery, having a plurality of stacked electrochemical cells 204, each of the cells 204 having a corresponding edge 206, e.g., an upper edge of the cell. The power supply 202 may be positioned within a receptacle or housing 210, which may include reference markers 215, each of the reference markers 215 being associated with a corresponding edge 206 of a respective one of the cells 204. The monitoring system 200 may also include an imaging device 220, a light source 230, and a temperature sensor 240, each of which may communicate (via wired or wireless communication) with the control system 110, e.g., aerial vehicle control system. The power supply 202, as shown in FIGS. 2-4, may be an example of the power supplies or modules 112 described herein with respect FIG. 1 and the power supply 806 described herein with respect to FIG. 8.

The power supply 202 may be a battery composed of one or more electrochemical cells 204, e.g., thirty to fifty cells. Although only five cells 204 are shown in FIG. 2, any other number, shape, or size of cells 204 may be included in the power supply 202. Each electrochemical cell 204 may be composed of a positive electrode or cathode layer, a negative electrode or anode layer, and a separation layer therebetween. The cathode and anode layers may comprise cathode and anode foils, respectively. The separation layer may include a conductive electrolyte containing cations, i.e., positively charged ions, and anions, i.e., negatively charged ions. Generally, during charging of a battery, cations may be reduced at the cathode layer by adding electrons, and anions may be oxidized at the anode layer by removing electrons, and during discharging of the battery, the flow of electrons may be reversed. However, in other embodiments, the processes described herein for charging and discharging a battery may be reversed.

In some embodiments, the power supply 202 may be a lithium-ion battery or a nickel-metal-hydride battery having one or more electrochemical cells 204 that exhibit intercalation. Intercalation describes a substantially reversible process by which ions move in and out of the crystal or lattice structure of layers of the battery during charging and/or discharging. As an example, ions may move into the crystal or lattice structure of the cathode and/or anode layers during charging, and ions may move out of the crystal or lattice structure of the cathode and/or anode layers during discharging, or vice versa. In other embodiments, the power supply 202 may be any other type or class of battery that exhibits intercalation.

In some embodiments, the electrochemical cells 204 may be stacked in a prismatic configuration, e.g., rectangular or cubic, such that successive layers of cathode and anode layers are stacked on top of each other. The stacked electrochemical cells 204 may be held together within a flexible or compliant casing, e.g., a polymer pouch, a flexible casing, or other compliant housing, that allows the electrochemical cells 204 to experience dimensional changes during operation. The dimensional changes may come about as a result of intercalation within each cell during charging and/or discharging. For example, during charging, intercalation may cause ions to be added to the cathode layer and/or the anode layer, thereby causing a dimensional change, e.g., an increase in physical dimension, of the electrochemical cells 204. Likewise, during discharging, intercalation may cause ions to be removed from the cathode layer and/or the anode layer, thereby causing a dimensional change, e.g., a decrease in physical dimension, of the electrochemical cells 204. In other embodiments, the dimensional changes caused by intercalation may be reversed, e.g., a decrease in physical dimension during charging and/or an increase in physical dimension during discharging.

In some embodiments, for a battery composed of stacked electrochemical cells 204 in a prismatic configuration, the dimensional change may be anisotropic and occur along a direction that is substantially perpendicular to the planes of the cathode and anode layers stacked on top of each other. In addition, one or more cells 204 of the power supply 202 may be associated with a respective edge 206 that is visible or recognizable within images captured using an imaging device. As shown in FIG. 2, each cell 204-1, 204-2, 204-3, 204-4, 204-5 may have a respective associated edge 206-1, 206-2, 206-3, 206-4, 206-5 that is recognizable within captured images. Alternatively, only one edge of the power supply 202, e.g., edge 206-1, may be recognizable within captured images. Any other number of edges 206 of the cells 204 may be recognizable within captured images.

The power supply 202 may be positioned within a receptacle or housing 210. The housing 210 may be made of any material to retain the power supply 202 and/or to protect the power supply 202 from an environment. For example, the housing 210 may be made of plastic, metal, or any other suitable material.

In addition, the housing 210 may include one or more reference markers 215 that are visible or recognizable within images captured using an imaging device. As shown in FIG. 2, the housing 210 may include reference markers 215-1, 215-2, 215-3, 215-4, 215-5 that are each associated with a respective edge 206-1, 206-2, 206-3, 206-4, 206-5 of a cell 204-1, 204-2, 204-3, 204-4, 204-5 and recognizable within captured images. Alternatively, only one reference marker associated with the power supply 202, e.g., reference marker 215-1, may be recognizable within captured images. Any other number of reference markers 215 may be provided on the housing 210 and recognizable within captured images.

The one or more reference markers 215 may be formed, printed, or otherwise placed on the housing 210 in various manners. For example, the reference markers 215 may be printed on a surface of the housing 210 using ink, paint, or any other marking material that is recognizable within captured images. In addition or alternatively, the reference markers 215 may be formed or embedded, e.g., as etches, cuts, marks, indices, grooves, protrusions, inks, paints, or other materials, on or within the material of the housing 210 so as to be recognizable within captured images.

Furthermore, although FIG. 2 shows the reference markers 215 as substantially straight lines, other shapes and/or sizes of the markers are possible. For example, the reference markers 215 may take the form of cross-hairs, plus-signs, arrows, or other indicators or symbols that are recognizable within captured images relative to an associated edge 206 of a cell 204. In addition, although the reference markers 215 are shown in FIG. 2 at a particular location on housing 210, the reference markers 215 may be formed, printed, or placed at any other suitable location that allows determination of a dimensional change of an edge 206 of a cell 204 relative to a respective associated reference marker 215.

In some embodiments, one or more of the edges 206 of the cells 204 of the power supply 202 may be formed, printed, or otherwise placed on the power supply 202 in a manner similar to the various embodiments described herein with respect to the placement of the reference markers 215 on the housing 210. For example, the edges 206 of the cells 204 may be printed on the casing or material of the power supply 202 using a marking material, or the edges 206 may be formed or embedded on or within the casing or material of the power supply 202, as described above with respect to the reference markers 215, such that the edges 206 of the cells 204 are recognizable within captured images.

The imaging device 220 may be any imaging device capable of capturing images of the edges 206 of the cells 204 and the reference markers 215 on the housing 210 in order to determine dimensions or dimensional changes of the edges 206 relative to the reference markers 215. The imaging device 220 may be positioned such that the edges 206 and the reference markers 215 are within a field of view of the imaging device 220. For example, the entire power supply 202, including all edges 206 and associated reference markers 215, may be within a field of view of the imaging device 220, or only a portion of the power supply 202, e.g., one or more edges 206 and one or more associated reference markers 215, may be within a field of view of the imaging device 220. Further, the imaging device 220 may be a high resolution digital camera. In addition, the imaging device 220 may include a macro lens or other similar lens or structure to enable capture of high resolution images at close range. Further, the imaging device 220 may capture images within the visible spectrum, e.g., within the human visible spectrum, within the infrared spectrum, or at any other wavelengths (or combinations of wavelengths) of light.

Any other types of imaging devices or combinations of imaging devices and lenses that are suitable for capturing images of the edges 206 of the cells 204 and the reference markers 215 on the housing 210 may also be utilized. Further, the imaging device 220 may capture moving images, or video, in addition to or as an alternative to still images. Various frames of captured video may be identified and analyzed in a manner similar to the analysis of captured still images, as described herein.

Information and/or data regarding edges 206 or reference markers 215 captured in imaging data by the imaging device 220, including edges, lines, indicia, symbols, outlines, surfaces, textures, or colors, may be extracted from the imaging data in any number of ways. For example, colors of pixels, or of groups of pixels, in a digital image may be determined and quantified according to one or more standards, e.g., the RGB ("red-green-blue") color model, in which the portions of red, green or blue in a pixel are expressed in three corresponding numbers ranging from 0 to 255 in value, or a hexadecimal model, in which a color of a pixel is expressed in a six-character code, wherein each of the characters may have a range of sixteen. Moreover, edges, lines, indicia, symbols, outlines, surfaces, textures, or features of edges 206 or reference markers 215 expressed in a digital image may be identified using one or more computer-based methods, such as by identifying changes in intensities within regions or sectors of the image, or by defining areas or portions of an image corresponding to specific surfaces, features, transitions, discontinuities, or edges.

Furthermore, edges, lines, indicia, symbols, outlines, contours, textures, colors, silhouettes, shapes, or other characteristics of edges 206 or reference markers 215 captured in still or moving digital images may be identified using one or more algorithms or machine-learning tools, which may be rule-based or learning algorithms and tools. The edges 206 or reference markers 215 may be stationary or in motion, and may be identified at single, finite periods of time, or over one or more periods or durations. Such algorithms or tools may be directed to recognizing and marking features, transitions, or discontinuities (e.g., the edges, lines, indicia, symbols, outlines, contours, textures, colors, silhouettes, shapes, or other characteristics of edges 206 or reference markers 215) within the digital images as closely as possible, and in a manner that minimizes noise and disruptions, and does not create false features, transitions, or discontinuities. Some detection algorithms or techniques that may be utilized in order to recognize characteristics of edges 206 or reference markers 215 in digital images in accordance with the present disclosure include, but are not limited to, Canny edge detectors or algorithms; Sobel operators, algorithms or filters; Kayyali operators; Roberts edge detection algorithms; Prewitt operators; Frei-Chen methods; any machine-learning based algorithms; or any other algorithms or techniques that may be known to those of ordinary skill in the pertinent arts.

Once the characteristics of stationary or moving edges 206 or reference markers 215 have been recognized in one or more digital images, such characteristics of the edges 206 or reference markers 215 may be matched against previously recognized information regarding the edges 206 or reference markers 215, which may be stored in one or more data stores. In this regard, dimensional changes between edges 206 and respective associated reference markers 215 may be determined based at least in part on previously captured images and information recognized therein.

In addition, distance estimation techniques may be used to determine physical dimensions and/or changes in physical dimension between the recognized edges 206 and reference markers 215, as well as between the recognized edges 206 and reference markers 215 within multiple captured images over time. The distance estimation techniques may be based at least in part on physical, material, chemical, electrical, and/or thermal properties of the cells 204 and the housing 210, physical, imaging, and/or thermal properties of the imaging device, a distance between the imaging device and the edges 206 or reference markers 215, a position and/or orientation of the imaging device relative to the edges 206 or reference markers 215, and/or other factors related to the components of the monitoring system and the captured images. The distance estimation techniques may also incorporate any machine-learning based algorithms or any other algorithms or techniques that may be known to those of ordinary skill in the pertinent arts.

The monitoring system 200 may also include a light source 230 that provides illumination to enable capture of high resolution images by the imaging device 220. For example, the light source 230 may be a separate component from the imaging device 220, or may form a part of the imaging device 220. The light source 230 may be positioned to provide illumination to the edges 206 of the cells 204 and the reference markers 215 on the housing 210. In addition, the light source 230 may provide light in any wavelength of light. For example, the light source 230 may provide light within the human visible spectrum of light if the imaging device 220 captures images within the human visible spectrum of light. Similarly, the light source 230 may provide light within the infrared spectrum if the imaging device 220 captures images within the infrared spectrum. Alternatively or in addition, the light source 230 may provide light at multiple different wavelengths of light, and/or may be selectively activated based on the operation and/or capabilities of the imaging device.

In other embodiments, the monitoring system 200 may not include a light source 230. Instead, the housing 210 may include one or more openings or be at least partially formed of a translucent or transparent material that allows light from the environment to enter the housing 210. For example, the environment of the housing 210 may include natural light, e.g., from the sun, ambient light, e.g., from one or more light sources associated with a structure, apparatus, or location in which the monitoring system 200 is located, and/or light from other light sources associated with the monitoring system 200, e.g., other light sources on the vehicle, system, machine, apparatus, instrument, device, or object on which the monitoring system 200 is provided.

Further, the monitoring system 200 may include a temperature sensor 240. The temperature sensor 240 may be any suitable sensor that can provide data related to a temperature of the power supply 202, individual cells 204 of the power supply 202, and/or the housing 210. The temperature sensor 240 may be provided on the power supply 202, as shown in FIG. 2. Alternatively, the temperature sensor 240 may be provided at any other location within or on the power supply 202, one or more cells 204, and/or the housing 210. Further, more than one temperature sensor 240 may be provided, and/or multiple temperature sensors 240 may be associated with and provide data related to temperatures of each respective cell 204 of the power supply 202.

The temperature data provided by the one or more temperature sensors 240 may be utilized to make corrections to the determined dimensions or dimensional changes of the cells 204 of the power supply 202 during operation, e.g., during charging and/or discharging. For example, one or more cells 204 of the power supply 202 may experience a thermal strain, e.g., an increase in physical dimension due to a temperature increase, during charging. Likewise, one or more cells 204 of the power supply 202 may experience a thermal strain, e.g., a decrease in physical dimension due to a temperature decrease, during discharging. In other embodiments, the thermal strain may be reversed, e.g., an increase in physical dimension due to a temperature increase during discharging, and/or a decrease in physical dimension due to a temperature decrease during charging.

The change in physical dimension of one or more cells 204 of the power supply 202 associated with a particular temperature or change in temperature may be determined by empirical methods, by referencing a data store including thermal strain of the cells of the power supply, and/or by reference to information associated with the thermal properties of the materials of the power supply.

Generally, the thermal strain of cells 204 of the power supply 202 may be isotropic such that the cells 204 experience the changes in physical dimension due to temperature changes substantially equally in all directions, unlike the anisotropic change in physical dimension due to intercalation within the cells 204, as described herein. Accordingly, in other embodiments, instead of or in addition to one or more temperature sensors 240, a change in physical dimension of the cells 204 due to thermal strain may be measured using an imaging device in a direction different from the direction of anisotropic change in physical dimension due to intercalation within the cells 204. For example, different edges of the cells 204 that are orthogonal to the edges 206 described herein, and respective associated reference markers that are also similarly orthogonal to the reference markers 215 described herein, may be captured using an imaging device to determine dimensional changes of the cells 204 due to thermal strain along a direction that is orthogonal to the direction of anisotropic change in physical dimension due to intercalation. Then, the determined dimensions or dimensional changes of the cells 204 due to intercalation may be corrected for any dimensional changes due to thermal strain as measured in the orthogonal direction.

In still other embodiments, instead of or in addition to one or more temperature sensors 240, the imaging device 220, or an additional imaging device, may capture one or more images in the infrared spectrum. Based on the captured infrared images, a temperature or change in temperature of the cells 204 may be determined. Then, the determined dimensions or dimensional changes of the cells 204 due to intercalation may be corrected based on the thermal strain due to the temperature or change in temperature determined from infrared images captured using the imaging device.

In some embodiments, data related to a temperature of the material of the housing 210, e.g., proximate the reference markers 215, may be provided using a temperature sensor 240 or based on thermal images using an imaging device 220, as described herein. The temperature of the housing 210 may further be used to correct the determined dimensions or dimensional changes of the cells 204 to account for thermal strain experienced by the housing material and the associated reference markers 215. For example, the housing 210 and associated reference markers 215 may expand due to a temperature increase and contract due to a temperature decrease. By determining and correcting for the thermal strain experienced by the housing material as well as the thermal strain experienced by the power supply 202, the dimensional change of the cells 204 due to intercalation may be more accurately and reliably determined.

Furthermore, the housing 210 may be formed of a material chosen to have thermal properties substantially similar to the combined thermal properties of the materials of the power supply 202. In this manner, the housing 210 and associated reference markers 215 may expand and contract in response to temperature changes at approximately the same rate as the expansion and contraction of the cells 204 of the power supply 202 in response to the same temperatures or temperature changes. Accordingly, it may be unnecessary to correct for dimensional changes of the power supply 202 and/or the housing 210 due to temperature changes, using the methods and structures described herein, because the dimensional changes that are determined using the imaging device based on the edges 206 of the cells 204 relative to the reference markers 215 may already be substantially inherently corrected for thermal strain, since the associated thermal strain of each of the relevant components may be approximately the same.

Referring again to FIG. 2, FIG. 2 shows a bottom of the power supply 202 supported by a bottom surface of the housing 210. Thus, any dimensions or dimensional changes may be measured using the bottom surface of the housing 210 as a reference surface or coupling plane, and the edges 206 of the cells 204 and the reference markers 215 expand and contract relative to the reference surface. However, in other embodiments, the cells 204 may be attached or coupled to a reference surface of the housing 210 at any other layer, position, or coupling plane within the power supply 202. For example, instead of the bottom surface of the power supply 202, edge 206-3 may be attached or coupled to the housing 210, such that edges 206-1, 206-2 and associated respective reference markers 215-1, 215-2 expand and contract in a direction relative to a reference surface or coupling plane associated with edge 206-3, and edges 206-4, 206-5 and associated respective reference markers 215-4, 215-5 expand and contract in an opposite direction relative to the reference surface or coupling plane associated with edge 206-3. Similarly, any other layer or surface of the power supply 202 may be attached or coupled to the housing 210 and thereby act as a reference surface or coupling plane from which dimensions or dimensional changes of the cells 204 may be determined.

In other embodiments, the monitoring system 200 may not include any reference markers 215 on the housing 210, and the power supply 202 may include only one edge, e.g., edge 206-1, that is recognizable within captured images. In such embodiments, a dimension or dimensional change of the power supply 202 as a whole may be determined from images captured using an imaging device 220. The physical dimension of the power supply 202 may be determined based on known physical, material, chemical, electrical, and/or thermal properties associated with the power supply 202, known physical, imaging, and/or thermal properties associated with the imaging device 220, and/or the distance, position, and/or orientation of the imaging device 220 relative to the power supply 202. In addition or alternatively, the physical dimension or dimensional changes of the power supply 202 may be determined based on a comparison of two or more images captured by the imaging device 220.

FIG. 3 is a schematic diagram of another power supply monitoring system 300, according to an implementation. The monitoring system 300 may utilize strain measurement techniques as described herein in order to determine a state of charge and/or a state of health of a power supply. For example, the monitoring system 300 may include one or more retainers 303, e.g., bands, straps, clamps, etc., that hold the electrochemical cells 204 of the power supply 202 together and that may apply a target pressure to the cells 204 for electrical conductivity therebetween. Further, the monitoring system 300 may include one or more strain gauges 305 to measure dimensions and/or displacements of one or more cells 204 of the power supply 202, which strain gauges 305 may communicate (via wired or wireless communication) with the control system 110, e.g., aerial vehicle control system.

The power supply monitoring system 300 may also include any or all of the features described herein with respect to the power supply monitoring system 200 shown in FIG. 2. For example, as described herein, the monitoring system 300 may include a power supply 202 having a plurality of stacked electrochemical cells 204, which may be positioned within a receptacle or housing 210, and the monitoring system 300 may include a temperature sensor 240, which may communicate (via wired or wireless communication) with the control system 110, e.g., aerial vehicle control system. The power supply 202, the stacked electrochemical cells 204, the housing 210, and the temperature sensor 240 may include any or all of the features described herein with respect to the same or similar components shown in FIG. 2. Further, although FIG. 3 does not illustrate the edges 206 of the cells 204, the reference markers 215 on the housing 210, the imaging device 220, or the light source 230, in some embodiments, the structures and methods described herein with respect to FIGS. 2 and 3 may be combined such that a combined monitoring system utilizing both optical estimation techniques and strain measurement techniques, simultaneously or alternately, may be used to monitor dimensions or dimensional changes of cells 204 of a power supply 202, which combination may provide greater accuracy, reliability, and/or redundancy.

Referring again to FIG. 3, the monitoring system 300 may include one or more retainers 303 that hold the cells 204 together and may apply a target pressure to the cells 204. Although not illustrated in FIG. 2, the cells 204 shown in FIG. 2 may also be held together in a similar manner by one or more retainers 303. The target pressure may be determined in order to provide a consistent electrical connection and/or conductivity between individual cells 204 of the power supply 202 for proper operation of the power supply 202 as a whole. The retainers 303 may be made of any material, e.g., plastic, metal, or other materials, that can hold the cells 204 and/or apply the target pressure to the cells 204. Further, the retainers 303 may be compliant, flexible, and/or resilient such that as the cells 204 expand and/or contract during charging or discharging, the pressure applied to the cells 204 may be substantially maintained at or near the target pressure. Although two retainers 303 are shown in FIG. 3, any other number, shape, or size of retainers 303 may be utilized in the monitoring systems 200, 300.

One or more retainers 303 may include one or more strain gauges 305 to measure a dimension or dimensional change of the retainer 303, and thereby of the cells 204. As shown in FIG. 3, retainer 303-1 may include a strain gauge 305-1 to measure a dimensional change of the retainer 303-1, and retainer 303-2 may include a strain gauge 305-2 to measure a dimensional change of the retainer 303-2. In addition or alternatively, one or more of the cells 204 may include a strain gauge 305 to measure a dimensional change of each respective cell 204. As shown in FIG. 3, cells 204-1, 204-2, 204-3, 204-4, 204-5 may each include a respective strain gauge 305-3, 305-4, 305-5, 305-6, 305-7 to measure a dimensional change of each respective cell 204-1, 204-2, 204-3, 204-4, 204-5.

A strain gauge may be any device configured to measure a strain of an object to which the strain gauge is applied or attached. The strain gauge may include an electrical conductor, e.g., a metallic foil or conductive strip, formed in a pattern on a flexible substrate. For example, the electrical conductor may be formed into a pattern of parallel lines running back and forth and adjacent to each other on a top surface of the flexible substrate. The bottom surface of the flexible substrate may include an adhesive to attach the strain gauge to an object to be measured. Alternatively, other methods of attaching the strain gauge to the object may be used. Strain gauges may generally be attached to an object with the parallel lines of the electrical conductor running substantially parallel to the direction of strain to be measured on the object.

Generally, strain gauges may measure strain, e.g., displacement or dimensional change, by measuring changes to electrical resistance or electrical conductance within the electrical conductor on the strain gauge. For example, when the electrical conductor is elastically stretched, i.e., the object to which the strain gauge is attached has increased in physical dimension, the electrical resistance of the strain gauge will increase. Likewise, when the electrical conductor is elastically compressed, i.e., the object to which the strain gauge is attached has decreased in physical dimension, the electrical resistance of the strain gauge will decrease. Based at least in part on physical, electrical, thermal, and/or material properties of the electrical conductor of the strain gauge and/or physical, material, chemical, electrical, and/or thermal properties of the retainers 303 and/or the cells 204 to which the strain gauge(s) are applied, a physical dimension and/or a change in physical dimension may be determined based on the measured changes in electrical resistance or electrical conductance due to strain.

As described herein with respect to FIG. 2, the monitoring system 300 as shown in FIG. 3 may also include one or more temperature sensors 240 on the power supply 202, on one or more of the cells 204, and/or on or within the housing 210 to provide data related to temperatures of respective components. The temperature data provided by the one or more temperature sensors 240 may be utilized to make corrections to the determined dimensions or dimensional changes of the cells 204 of the power supply 202 during operation, e.g., during charging and/or discharging. The dimensions or dimensional changes of one or more cells 204 of the power supply 202 associated with a particular temperature or change in temperature may be determined by empirical methods, by referencing a data store including thermal strain of the cells of the power supply, and/or by reference to information associated with the thermal properties of the materials of the power supply.

Generally, the thermal strain of cells 204 of the power supply 202 may be isotropic such that the cells 204 experience the changes in physical dimension due to temperature changes substantially equally in all directions, unlike the anisotropic change in physical dimension due to intercalation within the cells 204, as described herein. Accordingly, in other embodiments, instead of or in addition to one or more temperature sensors 240, a change in physical dimension of the cells 204 due to thermal strain may be measured using one or more strain gauges 305 that are aligned in a direction different from the direction of anisotropic change in physical dimension due to intercalation within the cells 204. For example, one or more strain gauges 305 that are applied to one or more of the cells 204 or the power supply 202 may be aligned in a direction that is orthogonal to the direction of anisotropic change in physical dimension due to intercalation within the cells 204. More specifically, the parallel lines of the electrical conductors within strain gauges that are intended to measure thermal strain may be substantially orthogonal to the parallel lines of the electrical conductors within strain gauges that are intended to measure a change in physical dimension due to intercalation within the cells 204. Based at least on strain measurements from one or more strain gauges aligned to measure thermal strain, the determined dimensions or dimensional changes of the cells 204 due to intercalation may be corrected for any dimensional changes due to thermal strain as measured in the orthogonal direction.

In still other embodiments in which optical estimation techniques and strain measurement techniques are combined, instead of or in addition to one or more temperature sensors 240, the imaging device 220, or another imaging device, may capture one or more images in the infrared spectrum. Based on the captured infrared images, a temperature or change in temperature of the cells 204 may be determined. Then, the determined dimensions or dimensional changes of the cells 204 due to intercalation may be corrected based on the thermal strain determined as a result of the temperature or change in temperature determined from infrared images captured using the imaging device.

FIG. 4 is a schematic diagram of a sequence 400 of states of charge of a battery, according to an implementation. FIG. 4 illustrates the sequence 400 using the optical estimation techniques described herein with respect to FIG. 2. However, the determinations of physical dimensions or changes in physical dimensions as described with respect to FIG. 4 are substantially equally applicable to the strain measurement techniques described herein with respect to FIG. 3, albeit within alternative embodiments that utilize strain gauges 305 in place of or in addition to the edges 206, the reference markers 215, and the imaging device 220.

FIG. 4 schematically shows example captured images of physical dimensions of electrochemical cells 204 of a power supply 202 within a housing 210 at three different times, e.g., time 1, time 2, and time 3, and at three different respective temperatures, e.g., Temp 1, Temp 2, and Temp 3. The cells 204 are shown at time 1, Temp 1 may be at reference, ideal, or ambient positions, in which each edge 206-1, 206-2, 206-3, 206-4, 206-5 of each cell 204-1, 204-2, 204-3, 204-4, 204-5 is aligned with a respective reference marker 215-1, 215-2, 215-3, 215-4, 215-5.

At time 2, Temp 2, which may be a later time than time 1 and a higher temperature than Temp 1, in some embodiments, the cells 204 of the power supply 202 may have been charged and thereby increased in physical dimensions due to intercalation within the cells 204 from the physical dimensions shown at time 1, Temp 1. Accordingly, each edge 206-1, 206-2, 206-3, 206-4, 206-5 of each cell 204-1, 204-2, 204-3, 204-4, 204-5 may no longer be aligned with its respective reference marker 215-1, 215-2, 215-3, 215-4, 215-5, i.e., each cell 204 has increased in physical dimension by an amount that can be determined by calculating changes in positions of the edges 206 relative to the reference markers 215 and/or relative to previously determined positions of the edges 206.

Based at least in part on a physical dimension or a change in physical dimension of a cell 204 of the power supply 202, a state of charge of the cell 204 may be determined. For example, if a cell 204 has been empirically determined or is otherwise known to exhibit approximately a 5% linear increase in physical dimension from 0% state of charge to 100% state of charge, a determined increase in physical dimension of 1% from time 1 to time 2 may be correlated with a 20% increase in state of charge. In addition, if a cell 204 has been empirically determined or is otherwise known to exhibit approximately a 5% linear increase in physical dimension from 0% state of charge to 100% state of charge and a physical dimension of the cell 204 at 0% state of charge is known, a determined physical dimension that is 2% greater than the known physical dimension at 0% state of charge may be correlated with a 40% current state of charge. Likewise, any other known physical dimension at a different relative state of charge of a cell may be used in combination with empirically determined or known changes in physical dimension to correlate a determined physical dimension with a current state of charge.

Similarly, at time 3, Temp 3, which may be a later time than time 1 or time 2 and a lower temperature than Temp 1 or Temp 2, in some embodiments, the cells 204 of the power supply 202 may have been discharged and thereby decreased in physical dimensions due to intercalation within the cells 204 from the physical dimensions shown at time 1, Temp 1 or time 2, Temp 2. Accordingly, each edge 206-1, 206-2, 206-3, 206-4, 206-5 of each cell 204-1, 204-2, 204-3, 204-4, 204-5 may no longer be aligned with its respective reference marker 215-1, 215-2, 215-3, 215-4, 215-5, i.e., each cell 204 has decreased in physical dimension by an amount that can be determined by calculating changes in positions of the edges 206 relative to the reference markers 215 and/or relative to previously determined positions of the edges 206.

Based at least in part on a physical dimension or a change in physical dimension of a cell 204 of the power supply 202, a state of charge of the cell 204 may be determined. For example, if a cell 204 has been empirically determined or is otherwise known to exhibit approximately a 4% linear decrease in physical dimension from 100% state of charge to 0% state of charge, a determined decrease in physical dimension of 1% from time 1 to time 3 may be correlated with a 25% decrease in state of charge. In addition, if a cell 204 has been empirically determined or is otherwise known to exhibit approximately a 4% linear decrease in physical dimension from 100% state of charge to 0% state of charge and a physical dimension of the cell 204 at 100% state of charge is known, a determined physical dimension that is 2% less than the known physical dimension at 100% state of charge may be correlated with a 50% current state of charge. Likewise, any other known physical dimension at a different relative state of charge of a cell may be used in combination with empirically determined or known changes in physical dimension to correlate a determined physical dimension with a current state of charge.

Each of the temperatures, e.g., Temp 1, Temp 2, and Temp 3, associated with the times of image capture, e.g., time 1, time 2, and time 3, as shown in FIG. 4, may be determined using any of the structures and methods described herein. For example, the temperatures may be determined using one or more temperature sensors 240 or from infrared or thermal imaging data captured using an infrared imaging device or thermal imaging sensor. Based on the determined temperatures and/or changes in temperature, the determined physical dimensions and/or changes in physical dimension may be corrected based on the determined temperatures and/or changes in temperature, e.g., between Temp 1 and Temp 2 or between Temp 1 and Temp 3. Further, as described herein, an imaging device or strain gauges may be used determine dimensional changes of the cells 204 due to thermal strain along a direction that is orthogonal to the direction of anisotropic change in physical dimension due to intercalation, and the determined physical dimensions and/or changes in physical dimension due to intercalation may be corrected based on the determined dimensional changes due to thermal strain.

Further, a state of health of one or more cells 204 of a power supply 202 may be determined by comparing the respective changes in physical dimension of two or more cells 204 over time. For example, as shown in FIG. 4, relative states of health of two or more cells 204 may be determined between time 1, Temp 1 and time 2, Temp 2. Taking cells 204-2 and 204-3 as examples, if the cells 204 are undergoing a charging operation from time 1 to time 2, cell 204-2 may be determined to have a greatest relative increase in physical dimension among the illustrated cells 204, whereas cell 204-3 may be determined to have a smallest relative increase in physical dimension. Accordingly, it may be determined that cell 204-2 has the lowest relative state of health among the illustrated cells 204, whereas cell 204-3 has the highest relative state of health. More specifically, cell 204-2 may have the lowest relative capacity because cell 204-2 may reach a full state of charge faster than the other illustrated cells 204, whereas cell 204-3 may have the highest relative capacity. Other parameters related to states of health of cells, e.g., resistance, impedance, conductance, voltage, and others, may also be determined by such comparisons over time.

As an additional example, as shown in FIG. 4, relative states of health of two or more cells 204 may be determined between time 1, Temp 1 and time 3, Temp 3. Taking cells 204-2 and 204-3 again as examples, if the cells 204 are undergoing a discharging operation from time 1 to time 3, cell 204-2 may be determined to have a greatest relative decrease in physical dimension among the illustrated cells 204, whereas cell 204-3 may be determined to have a smallest relative decrease in physical dimension. Accordingly, it may be determined that cell 204-2 has the lowest relative state of health among the illustrated cells 204, whereas cell 204-3 has the highest relative state of health. More specifically, cell 204-2 may have the lowest relative capacity because cell 204-2 may reach a zero state of charge faster than the other illustrated cells 204, whereas cell 204-3 may have the highest relative capacity. Other parameters related to states of health of cells, e.g., resistance, impedance, conductance, voltage, and others, may also be determined by such comparisons over time.

Further, if the physical dimensions and/or the changes in physical dimension of a cell having ideal specifications are empirically determined and/or are otherwise known, physical dimensions, changes in physical dimension and/or states of charge of the cell may be determined over time and compared to the empirically determined or known dimensions and/or changes in dimension of the cell having ideal specifications to determine a current state of health of the cell relative to the ideal specifications. In addition, a state of health of a cell may be determined by comparison with previous or historical determinations of dimensions or dimensional changes of the cell, which may be stored in one or more data stores.

Figure 5A:
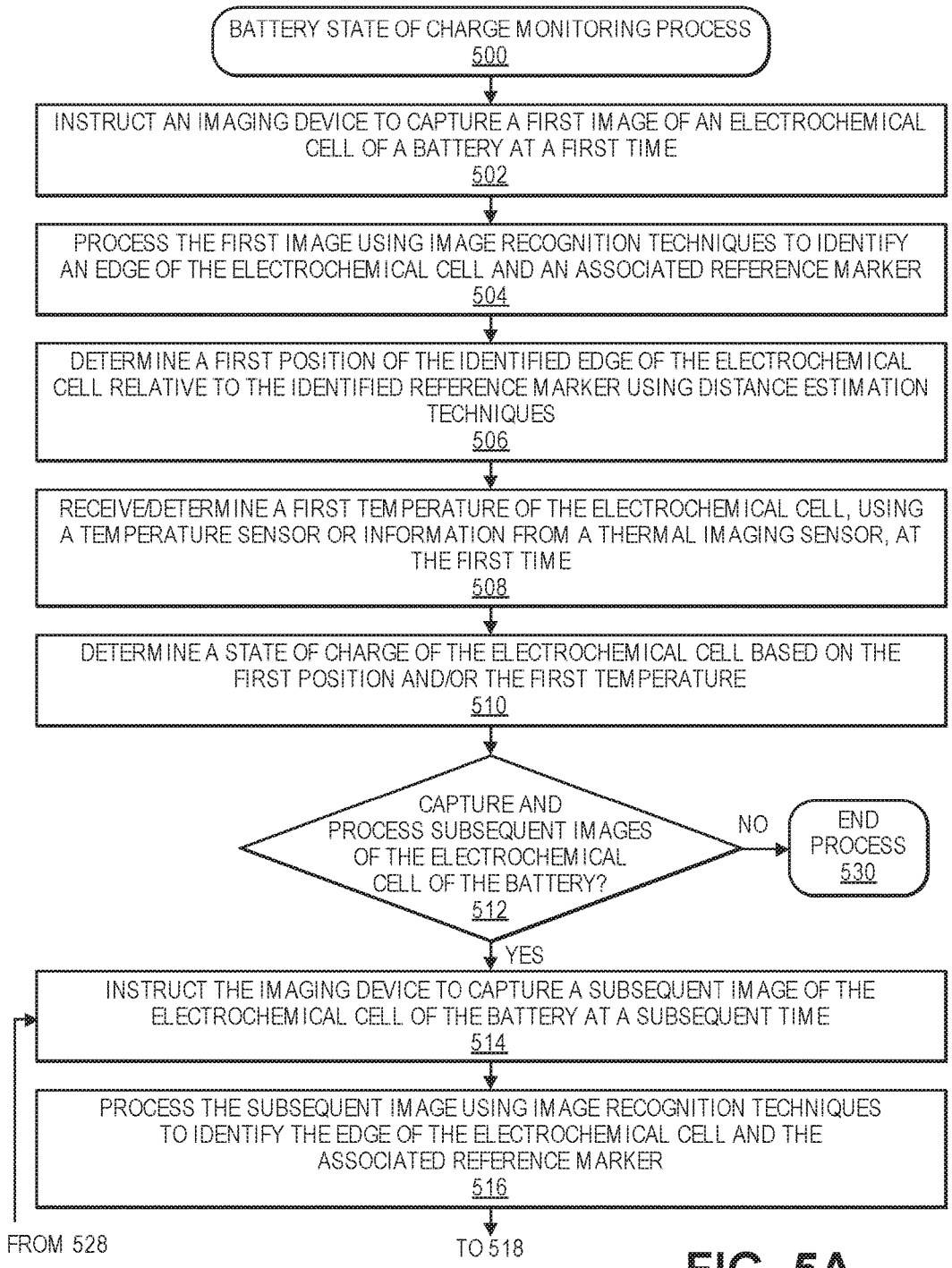
FIGS. 5A-5B are flow diagrams illustrating an example battery state of charge monitoring process, according to an implementation.
Figure 5B:
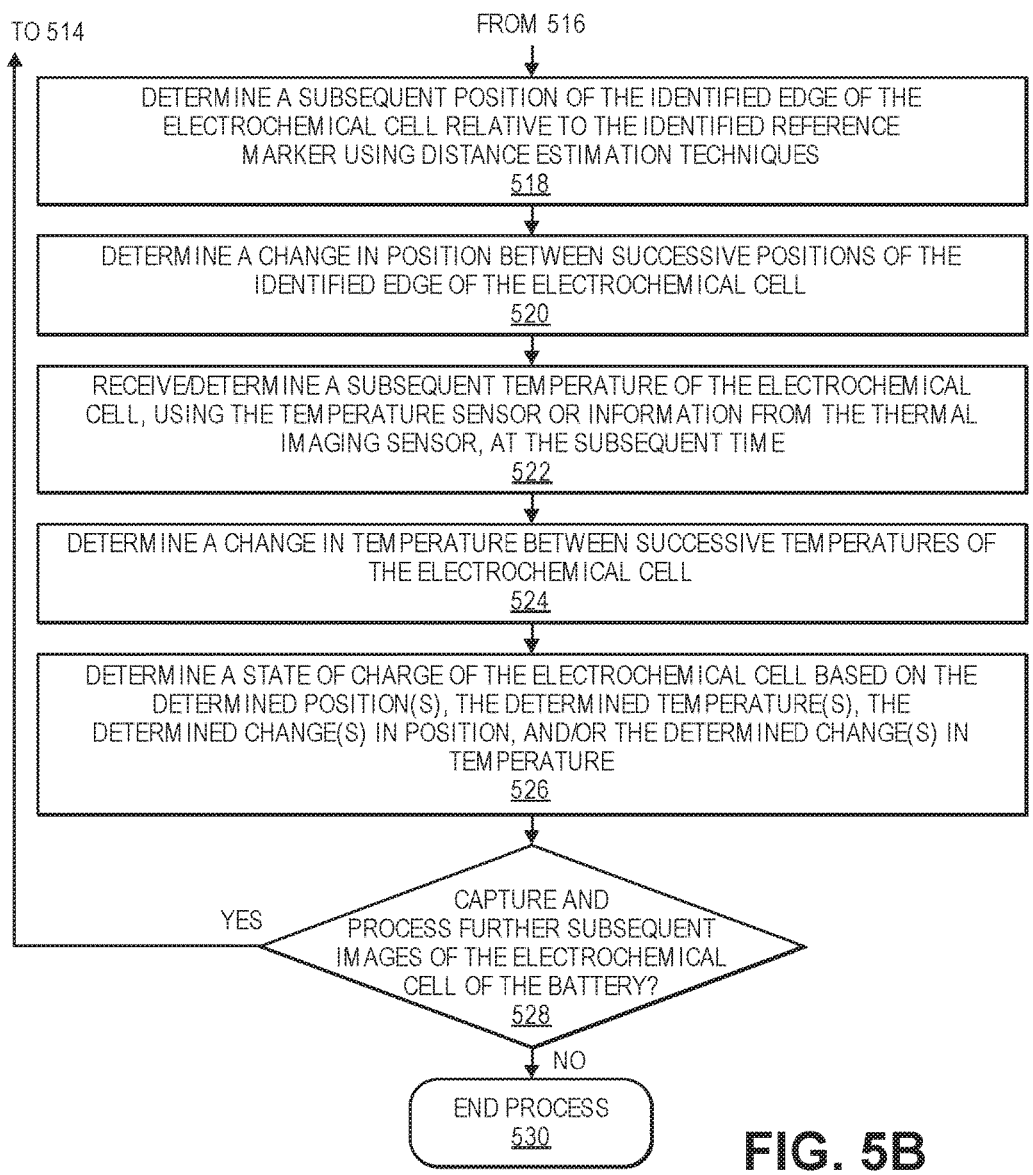

FIGS. 5A-5B are flow diagrams illustrating an example battery state of charge monitoring process 500, according to an implementation. The process 500 may begin by instructing an imaging device to capture a first image of an electrochemical cell of a battery at a first time, as at 502. For example, the captured first image may include one or more edges of the battery and one or more respective associated reference markers on the housing. Then, the first image may be processed using one or more image recognition techniques to identify an edge of the electrochemical cell and a reference marker associated with the identified edge, as at 504. Upon identifying an edge and an associated reference marker in the first image, a first position of the edge relative to the associated reference marker may be determined using one or more distance estimation techniques, as at 506.

The process 500 may also receive and/or determine a first temperature of the electrochemical cell at the first time, as at 508. The first temperature may be determined using a temperature sensor or from infrared or thermal imaging data captured using an infrared imaging device or thermal imaging sensor, as described herein. Then, a change in dimension due to thermal strain may be determined based at least in part on the first temperature. In addition or alternatively, the change in dimension due to thermal strain may be determined using the imaging device to measure a change in dimension in a direction orthogonal to the direction of anisotropic change in dimension due to intercalation, as described herein.

Based at least in part on the determined first position and/or the first temperature, a state of charge of the electrochemical cell may be determined, as at 510. For example, the first position of the edge relative to the associated reference marker may be corrected to account for thermal strain at the first temperature. Then, the state of charge of the electrochemical cell may be determined based on the corrected, first position, e.g., based on empirical data for the cell, based on one or more previous determinations of the state of charge of the cell, and/or based on other information related to properties of the cell.

The process 500 may continue by determining whether to capture and process any subsequent images of the electrochemical cell of the battery, as at 512. If the monitoring of the battery is complete or is otherwise to be stopped, the process 500 may end, as at 530.

If, however, the monitoring of the battery is to continue, the process 500 may continue by instructing the imaging device to capture a subsequent image of the electrochemical cell of the battery at a subsequent time, as at 514. For example, the captured subsequent image may include one or more edges of the battery and one or more respective associated reference markers on the housing. Then, the subsequent image may be processed using one or more image recognition techniques to identify the edge of the electrochemical cell and the reference marker associated with the identified edge, as at 516. Upon identifying the edge and the associated reference marker in the subsequent image, a subsequent position of the edge relative to the associated reference marker may be determined using one or more distance estimation techniques, as at 518. The process 500 may then determine a change in position between successive positions of the identified edge of the electrochemical cell, as at 520. For example, a change in position may be determined between the subsequent position and the first position and/or between successive subsequent positions.

The process 500 may also receive and/or determine a subsequent temperature of the electrochemical cell at the subsequent time, as at 522. The subsequent temperature may be determined using a temperature sensor or from infrared or thermal imaging data captured using an infrared imaging device or thermal imaging sensor, as described herein. The process 500 may also determine a change in temperature between successive temperatures of the electrochemical cell, as at 524. For example, a change in temperature may be determined between the subsequent temperature and the first temperature and/or between successive subsequent temperatures. Then, a change in dimension due to thermal strain may be determined based at least in part on the subsequent temperature or the change in successive temperatures. In addition or alternatively, the change in dimension due to thermal strain may be determined using the imaging device to measure a change in dimension in a direction orthogonal to the direction of anisotropic change in dimension due to intercalation, as described herein.

Based at least in part on the determined position(s), the determined temperature(s), the determined change(s) in position, and/or the determined change(s) in temperature, a state of charge of the electrochemical cell may be determined, as at 526. For example, the determined position or change in position of the edge relative to the associated reference marker or relative to one or more previous determinations of position may be corrected to account for thermal strain at the determined temperature or due to the determined change in temperature. Then, the state of charge of the electrochemical cell may be determined based on the corrected, determined position or the corrected, determined change in position, e.g., based on empirical data for the cell, based on one or more previous determinations of the state of charge of the cell, and/or based on other information related to properties of the cell.

The process 500 may continue by determining whether to capture and process any further subsequent images of the electrochemical cell of the battery, as at 528. If the monitoring of the battery is complete or is otherwise to be stopped, the process 500 may end, as at 530. If, however, the monitoring of the battery is to continue, the process 500 may return to 514.

Although FIGS. 5A-5B primarily refer to using optical estimation techniques to determine a state of charge of an electrochemical cell of a battery, the process 500 may also utilize the strain measurement techniques described herein. For example, the process 500 may be modified to receive and analyze strain gauge data from one or more strain gauges, instead of or in addition to capturing images using an imaging device, in order to determine a physical dimension or a change in physical dimension of a cell. In addition, the process 500 may be modified to receive and analyze strain gauge data from one or more strain gauges, instead of or in addition to capturing images using an imaging device, in order to determine a thermal strain of the cell in a direction orthogonal to the direction of anisotropic change in dimension due to intercalation, as described herein. Then, the process 500 may determine a state of charge of the electrochemical cell based at least in part on the determined position(s), the determined temperature(s), the determined change(s) in position, and/or the determined change(s) in temperature using the strain measurement techniques described herein.

Figure 6A:
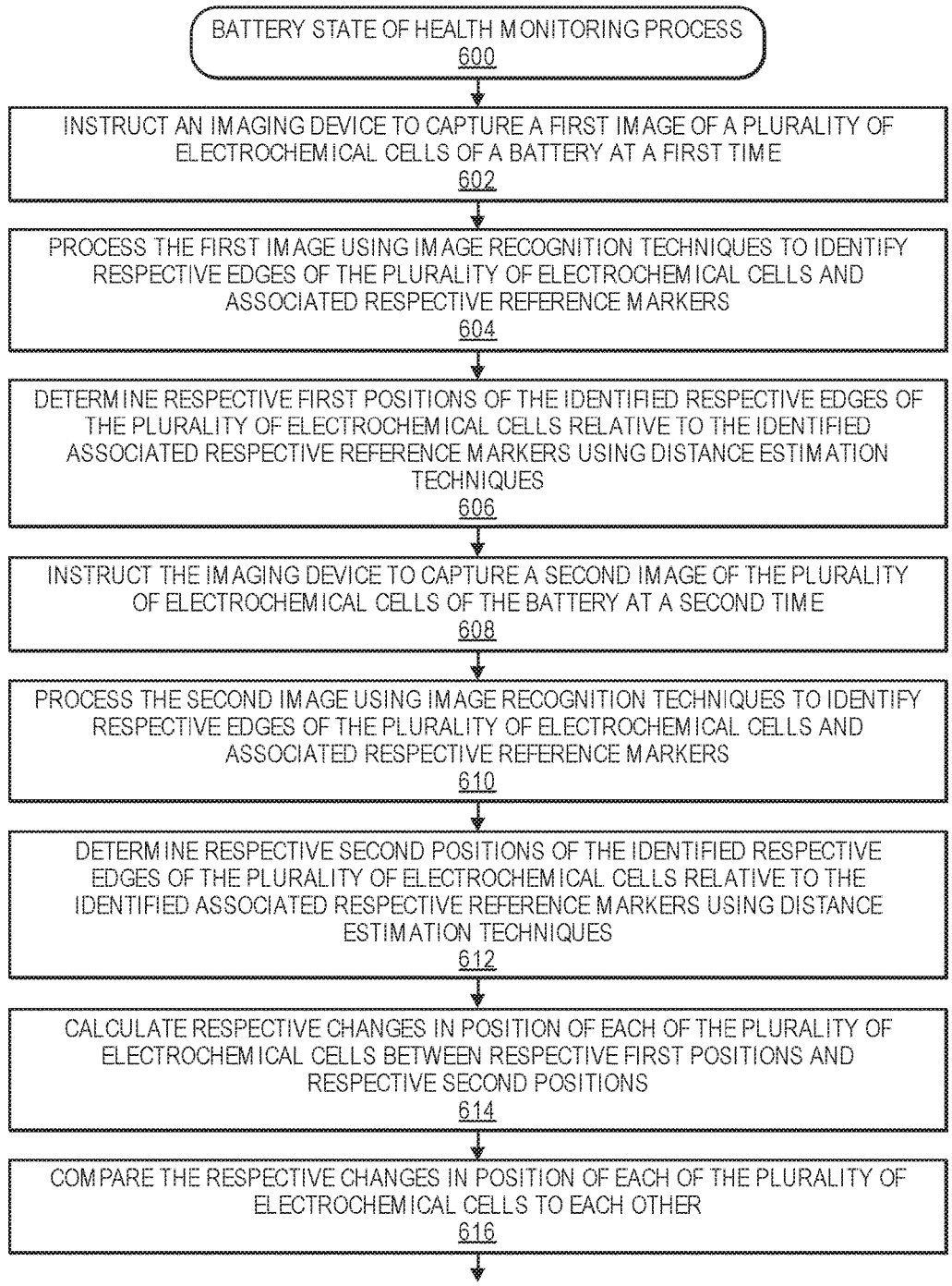
FIGS. 6A-6B are flow diagrams illustrating an example battery state of health monitoring process, according to an implementation.
Figure 6B:
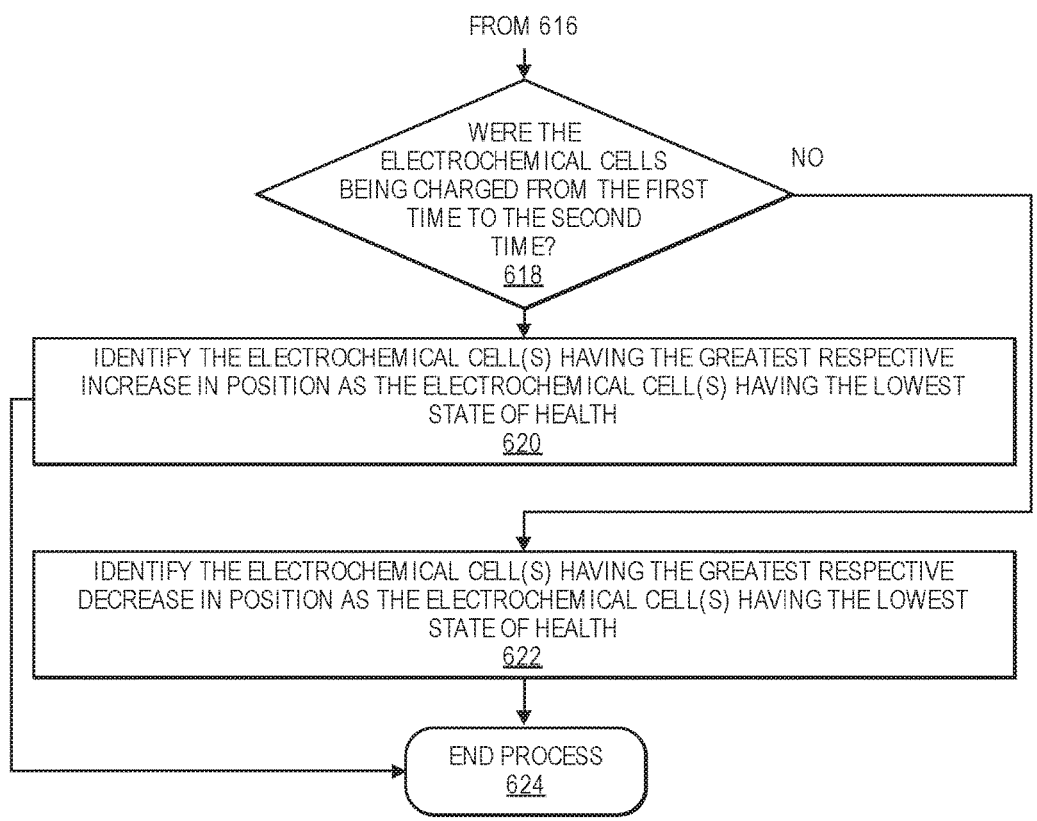

FIGS. 6A-6B are flow diagrams illustrating an example battery state of health monitoring process 600, according to an implementation. The process 600 may begin by instructing an imaging device to capture a first image of a plurality of electrochemical cells of a battery at a first time, as at 602. For example, the captured first image may include one or more edges of the battery and one or more respective associated reference markers on the housing. Then, the first image may be processed using one or more image recognition techniques to identify edges of the plurality of electrochemical cells and respective reference markers associated with the identified edges, as at 604. Upon identifying the edges and associated respective reference markers in the first image, respective first positions of the identified edges relative to the associated respective reference markers may be determined using one or more distance estimation techniques, as at 606.

The process 600 may continue by instructing an imaging device to capture a second image of the plurality of electrochemical cells of the battery at a second time, as at 608. For example, the captured second image may include the one or more edges of the battery and the one or more respective associated reference markers on the housing. Then, the second image may be processed using one or more image recognition techniques to identify the edges of the plurality of electrochemical cells and the respective reference markers associated with the identified edges, as at 610. Upon identifying the edges and associated respective reference markers in the second image, respective second positions of the identified edges relative to the associated respective reference markers may be determined using one or more distance estimation techniques, as at 612.

The process 600 may continue by calculating respective changes in position of each of the plurality of cells between the determined respective first positions and the determined respective second positions of the identified edges, as at 614.

Then, the respective changes in position of each of the plurality of cells may be compared to each other, as at 616. For example, based on the comparison, it may be determined that a first cell of the plurality of cells has experienced a greatest change in position between its respective first and second positions. Likewise, it may be determined that a second cell of the plurality of cells has experienced a smallest change in position between its respective first and second positions.

In addition, it may be determined that all of the plurality of cells have experienced approximately the same change in position between their respective first and second positions. Further, it may be determined that each (or a portion) of the plurality of cells has experienced different respective changes in position between their respective first and second positions.

The process 600 may continue by determining whether the plurality of cells were being charged from the first time to the second time, as at 618. If the cells were being charged, then a first cell of the plurality of cells that has experienced a greatest increase in position between its respective first and second positions may be identified as having the lowest state of health, as at 620. For example, the greatest increase in position of the first cell may indicate a reduced capacity for the first cell because the first cell may reach a full state of charge more quickly than other similar cells or as compared to its ideal specifications. Likewise, it may be determined that a second cell of the plurality of cells that has experienced a smallest increase in position between its respective first and second positions may be identified as having the highest state of health. For example, the smallest increase in position of the second cell may indicate a higher capacity for the second cell because the second cell may reach a full state of charge more slowly than other similar cells or more closely to its ideal specifications.

In addition, if all of the plurality of cells have experienced approximately the same increase in position between their respective first and second positions, it may be determined that all of the cells have relatively similar states of health, indicating that the cells of the battery as a whole may be balanced. Further, if each (or a portion) of the plurality of cells has experienced different respective increases in position between their respective first and second positions, it may be determined that the cells have relatively dissimilar states of health, indicating that the cells of the battery as a whole may be unbalanced. Thereafter, the process 600 may end, as at 624.

Returning to 618, if the cells were not being charged (and thus being discharged), then a first cell of the plurality of cells that has experienced a greatest decrease in position between its respective first and second positions may be identified as having the lowest state of health, as at 622. For example, the greatest decrease in position of the first cell may indicate a reduced capacity for the first cell because the first cell may reach a zero state of charge more quickly than other similar cells or as compared to its ideal specifications. Likewise, it may be determined that a second cell of the plurality of cells that has experienced a smallest decrease in position between its respective first and second positions may be identified as having the highest state of health. For example, the smallest decrease in position of the second cell may indicate a higher capacity for the second cell because the second cell may reach a zero state of charge more slowly than other similar cells or more closely to its ideal specifications.

In addition, if all of the plurality of cells have experienced approximately the same decrease in position between their respective first and second positions, it may be determined that all of the cells have relatively similar states of health, indicating that the cells of the battery as a whole may be balanced. Further, if each (or a portion) of the plurality of cells has experienced different respective decreases in position between their respective first and second positions, it may be determined that the cells have relatively dissimilar states of health, indicating that the cells of the battery as a whole may be unbalanced. Thereafter, the process 600 may end, as at 624.

Although FIGS. 6A-6B primarily refer to using optical estimation techniques to determine a state of health of an electrochemical cell of a battery, the process 600 may also utilize the strain measurement techniques described herein. For example, the process 600 may be modified to receive and analyze strain gauge data from one or more strain gauges, instead of or in addition to capturing images using an imaging device, in order to determine a physical dimension or a change in physical dimension of a cell. Further, with either optical estimation techniques or strain measurement techniques, the process 600 may be modified to receive and/or determine temperature data and correct the determined physical dimensions or changes in physical dimension based on the thermal strain, using any of the structures and methods described herein.

Figure 7:
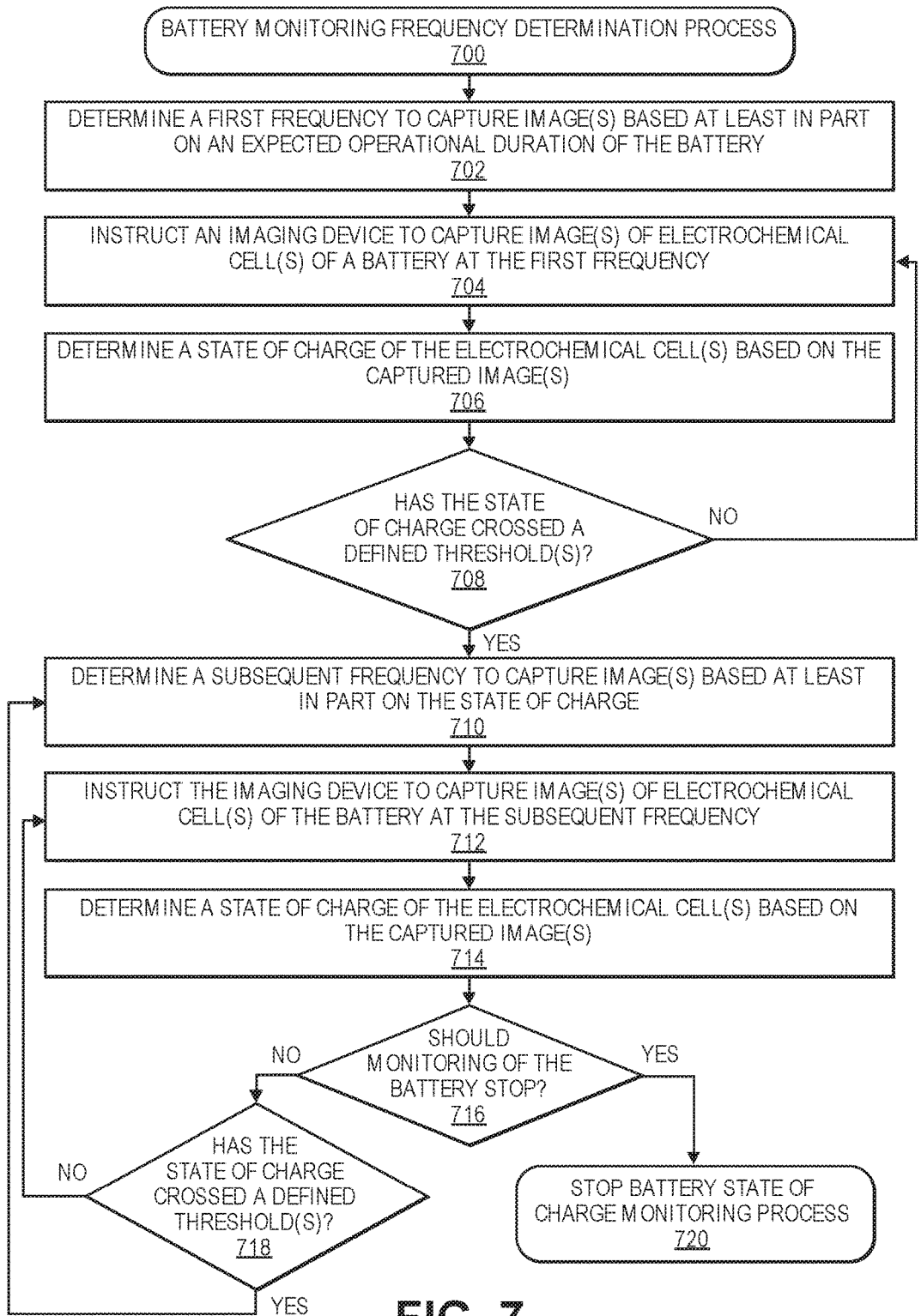
FIG. 7 is a flow diagram illustrating an example battery monitoring frequency determination process, according to an implementation.

FIG. 7 is a flow diagram illustrating an example battery monitoring frequency determination process 700, according to an implementation. The process 700 may begin by determining a first frequency at which to capture images based at least in part on an expected operational duration of the battery, as at 702. For example, if the battery is expected to operate for 30 minutes, the first frequency may be set at approximately once every 5-10 seconds. Alternatively or in addition, the determination of the first frequency may be based on a default frequency, an expected life of the battery, an age of the battery, an expected operational duration of a vehicle, system, machine, apparatus, instrument, device, or object in which the battery is used, previous determinations of states of charge and/or states of health of one or more cells of the battery, an expected rate of charging or discharging of the battery, and/or other factors.

The process 700 may continue by instructing an imaging device to capture images of electrochemical cells of the battery at the first frequency, as at 704. Then, the process 700 may determine states of charge of the electrochemical cells of the battery based on the captured images, as at 706, as described herein with respect to FIGS. 5A-5B. It may then be determined whether one or more of the states of charge of the cells have crossed a defined threshold, as at 708. If not, the process 700 may return to 704 and continue instructing the imaging device to capture images at the first frequency.

If a defined threshold for one or more of the states of charge of the cells has been crossed at 708, then the process 700 may determine a subsequent frequency at which to capture images based at least in part on the states of charge, as at 710. For example, if the battery is being discharged and one or more of the states of charge have crossed a defined threshold of 25% state of charge, then a higher frequency than the first frequency may be determined as the subsequent frequency. Likewise, if the battery is being charged and one or more of the states of charge have crossed a defined threshold of 75% state of charge, then a higher frequency than the first frequency may be determined as the subsequent frequency. Any other defined thresholds, numbers of thresholds, and associated increases or decreases in monitoring frequency can also be implemented with the monitoring systems and methods described herein.

The process 700 may continue by instructing the imaging device to capture images of electrochemical cells of the battery at the subsequent frequency, as at 712. Then, the process 700 may determine states of charge of the electrochemical cells of the battery based on the captured images, as at 714, as described herein with respect to FIGS. 5A-5B. It may then be determined whether monitoring of the battery should be stopped, as at 716. If yes, then the monitoring of the battery may be ended, as at 720.

If, however, the monitoring of the battery is to continue, then it may be determined whether one or more of the states of charge of the cells have crossed another defined threshold, as at 718. If not, the process 700 may return to 712 and continue instructing the imaging device to capture images at the previously determined subsequent frequency. If another defined threshold for the states of charge has been crossed at 718, then the process 700 may return to 710 and determine a new subsequent frequency at which to capture images based at least in part on the states of charge.

Using the process 700 described herein, the frequency at which electrochemical cells of the battery are monitored may be varied over time as a function of the states of charge of one or more cells of the battery. For example, the monitoring frequency may increase or decrease as the states of charge of the cells decrease, the monitoring frequency may also increase or decrease as the states of charge of the cells increase, and/or the monitoring frequency may be higher at extreme ranges of the states of charge, e.g., closer to fully charged or closer to fully discharged, and may be lower at middle ranges of the states of charge, e.g., closer to 50% state of charge. In addition, other methods of varying the frequency at which the cells are monitored may also be used. Further, the monitoring frequency may be selected or commanded by a control system or by an operator of the system either automatically, semi-automatically, or manually, e.g., in response to certain events, at particular operating modes of the battery, while undergoing testing or evaluation, responsive to errors within the power supply, the power monitoring system, the control system, or other systems in which the battery is used, etc.

In addition or alternatively, while the process 700 is described herein with respect to determining subsequent monitoring frequencies based on states of charge and defined thresholds related to states of charge, the process 700 may also determine states of health of the electrochemical cells, as described herein with respect to FIGS. 6A-6B, or any other operational, electrical, chemical, material, thermal, or physical properties of the cells. Further, the defined thresholds may be related to determined states of health of the cells, or any other operational, electrical, chemical, material, thermal, or physical properties of the cells in addition to or in place of the defined thresholds related to states of charge, and the subsequent monitoring frequencies may be determined based on one or more of the states of health, or any other operational, electrical, chemical, material, thermal, or physical properties of the cells, or combinations thereof.

Further, although FIG. 7 primarily refers to using optical estimation techniques to determine monitoring frequencies of an electrochemical cell of a battery, the process 700 may also utilize the strain measurement techniques described herein. For example, the process 700 may be modified to receive and analyze strain gauge data from one or more strain gauges at the determined frequencies, instead of or in addition to capturing images using an imaging device, in order to determine states of charge of the cells and modify or adjust the monitoring frequencies accordingly. Further, with either optical estimation techniques or strain measurement techniques, the process 700 may be modified to receive and/or determine temperature data at the determined frequencies and correct the determined physical dimensions or changes in physical dimension based on the thermal strain, using any of the structures and methods described herein.

Figure 8:
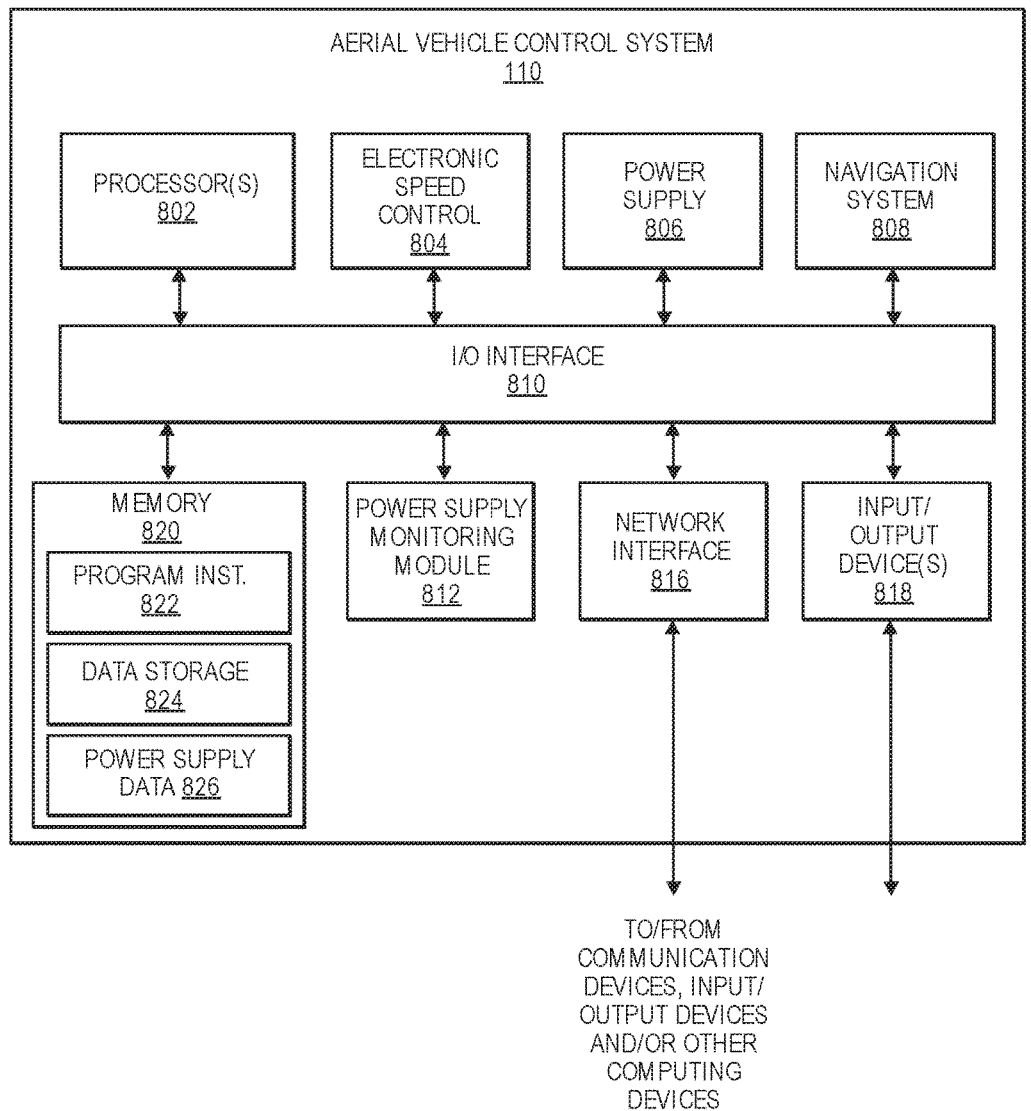
FIG. 8 is a block diagram illustrating various components of an aerial vehicle control system, according to an implementation.

FIG. 8 is a block diagram illustrating various components of an example aerial vehicle control system or controller 110, according to an implementation. In various examples, the block diagram may be illustrative of one or more aspects of the aerial vehicle control system 110 that may be used to implement the various systems and processes discussed above. Although described with reference to an aerial vehicle, all or portions of the components described herein may form a control system or controller 110 for any other vehicle, system, machine, apparatus, device, instrument, or object in which the monitoring systems and corresponding methods described herein may be implemented.

In the illustrated implementation, the aerial vehicle control system 110 includes one or more processors 802, coupled to a non-transitory computer readable storage medium 820 via an input/output (I/O) interface 810. The aerial vehicle control system 110 may also include an electronic speed controller 804, a power supply 806, and/or a navigation system 808. The aerial vehicle control system 110 further includes a power supply monitoring module 812, a network interface 816, and one or more input/output devices 818.

In various implementations, the aerial vehicle control system 110 may be a uniprocessor system including one processor 802, or a multiprocessor system including several processors 802 (e.g., two, four, eight, or another suitable number). The processor(s) 802 may be any suitable processor capable of executing instructions. For example, in various implementations, the processor(s) 802 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 802 may commonly, but not necessarily, implement the same ISA.

The non-transitory computer readable storage medium 820 may be configured to store executable instructions, data, and power supply data and/or characteristics, including state of charge data and/or history, state of health data and/or history, physical dimension data, dimensional change data, temperature data, imaging data, strain gauge data, and/or other data items accessible by the processor(s) 802. In various implementations, the non-transitory computer readable storage medium 820 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 820 as program instructions 822, data storage 824 and power supply data 826, respectively. In other implementations, program instructions, data and/or power supply data may be received, sent or stored upon different types of computer-accessible media, such as non-transitory media, or on similar media separate from the non-transitory computer readable storage medium 820 or the aerial vehicle control system 110.

Generally, a non-transitory, computer readable storage medium may include storage media or memory media such as magnetic or optical media, e.g., disk or CD/DVD-ROM, coupled to the aerial vehicle control system 110 via the I/O interface 810. Program instructions and data stored via a non-transitory computer readable medium may be transmitted by transmission media or signals, such as electrical, electromagnetic, or digital signals, which may be conveyed via a communication medium such as a network and/or a wireless link, such as may be implemented via the network interface 816.

In one implementation, the I/O interface 810 may be configured to coordinate I/O traffic between the processor(s) 802, the non-transitory computer readable storage medium 820, and any peripheral devices, the network interface or other peripheral interfaces, such as input/output devices 818. In some implementations, the I/O interface 810 may perform any necessary protocol, timing or other data transformations to convert data signals from one component (e.g., non-transitory computer readable storage medium 820) into a format suitable for use by another component (e.g., processor(s) 802). In some implementations, the I/O interface 810 may include support for devices attached through various types of peripheral buses, such as a variant of the Peripheral Component Interconnect (PCI) bus standard or the Universal Serial Bus (USB) standard, for example. In some implementations, the function of the I/O interface 810 may be split into two or more separate components, such as a north bridge and a south bridge, for example. Also, in some implementations, some or all of the functionality of the I/O interface 810, such as an interface to the non-transitory computer readable storage medium 820, may be incorporated directly into the processor(s) 802.

The electronic speed control 804 communicates with the navigation system 808 and adjusts the operational characteristics of each propulsion mechanism to guide the aerial vehicle along a determined path and/or to perform other navigational maneuvers. The navigation system 808 may include a GPS or other similar system than can be used to navigate the aerial vehicle to and/or from a location.

The aerial vehicle control system 110 may also include a power supply monitoring module 812 that communicates with the processor(s) 802, the non-transitory computer readable storage medium 820, the imaging device 220, the light source 230, the temperature sensor 240, the strain gauges 305, and/or other components to monitor the state of charge and/or the state of health of the power supply 806, as discussed above.

The network interface 816 may be configured to allow data to be exchanged between the aerial vehicle control system 110, other devices attached to a network, such as other computer systems, the imaging device 220, the light source 230, the temperature sensor 240, the strain gauges 305, and/or control systems of other vehicles, systems, machines, apparatuses, instruments, devices, or objects. For example, the network interface 816 may enable wireless communication between numerous aerial vehicles. In various implementations, the network interface 816 may support communication via wireless general data networks, such as a Wi-Fi network. For example, the network interface 816 may support communication via telecommunications networks such as cellular communication networks, satellite networks, and the like.

Input/output devices 818 may, in some implementations, include one or more displays, image capture devices, thermal sensors, infrared sensors, time of flight sensors, accelerometers, pressure sensors, weather sensors, etc. Multiple input/output devices 818 may be present and controlled by the aerial vehicle control system 110. One or more of these sensors may be utilized to assist in monitoring the state of charge and/or state of health of the power supply.

As shown in FIG. 8, the memory may include program instructions 822 which may be configured to implement the example processes and/or sub-processes described above. The data storage 824 may include various data stores for maintaining data items that may be provided for monitoring a state of charge and/or a state of health of the power supply. For example, the power supply data 826 and/or the data storage 824 may include state of charge data and/or history, state of health data and/or history, temperature data, imaging data, strain gauge data, etc.

The power supply data 826 and/or the data storage 824 may also include any data related to material, chemical, thermal, electrical, and/or physical properties, operational characteristics, states of charge, states of health, ideal specifications, historical data related to any of the properties and/or characteristics, dimensional data, temperature data, and/or other data related to the power supply 202 and/or individual cells 204 of the power supply 202. The power supply data 826 and/or the data storage 824 may also include data related to material, thermal, and/or physical properties, historical data related to any of the properties and/or characteristics, dimensional data, temperature data, and/or other data related to the housing 210 and/or the retainers 303. Further, the power supply data 826 and/or the data storage 824 may also include data related to imaging, thermal, and/or physical properties, operational characteristics, historical data related to any of the properties and/or characteristics, temperature data, and/or other data related to the imaging device 220 and/or the light source 230. Moreover, the power supply data 826 and/or the data storage 824 may also include data related to material, thermal, electrical, and/or physical properties, operational characteristics, historical data related to any of the properties and/or characteristics, dimensional data, temperature data, and/or other data related to the temperature sensors 240 and/or the strain gauges 305.

In various implementations, the parameter values and other data illustrated herein as being included in one or more data stores may be combined with other information not described or may be partitioned differently into more, fewer, or different data structures. In some implementations, data stores may be physically located in one memory or may be distributed among two or more memories.

Each process described herein may be implemented by the architectures described herein or by other architectures. The processes are illustrated as a collection of blocks in a logical flow. Some of the blocks represent operations that can be implemented in hardware, software, or a combination thereof. In the context of software, the blocks represent computer-executable instructions stored on one or more computer readable media that, when executed by one or more processors, perform the recited operations. Generally, computer-executable instructions include routines, programs, objects, components, data structures, and the like that perform particular functions or implement particular abstract data types.

The computer readable media may include non-transitory computer readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some implementations, the computer readable media may include a transitory computer readable signal (in compressed or uncompressed form). Examples of computer readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process. Additionally, one or more of the operations may be considered optional and/or not utilized with other operations.

Those skilled in the art will appreciate that the aerial vehicle control system 110 is merely illustrative and is not intended to limit the scope of the present disclosure. In particular, the computing system and devices may include any combination of hardware or software that can perform the indicated functions, including computers, network devices, internet appliances, PDAs, wireless phones, pagers, etc. The aerial vehicle control system 110 may also be connected to other devices that are not illustrated, or instead may operate as a stand-alone system. In addition, the functionality provided by the illustrated components may, in some implementations, be combined in fewer components or distributed in additional components. Similarly, in some implementations, the functionality of some of the illustrated components may not be provided and/or other additional functionality may be available.

Those skilled in the art will also appreciate that, while various items are illustrated as being stored in memory or storage while being used, these items or portions of them may be transferred between memory and other storage devices for purposes of memory management and data integrity. Alternatively, in other implementations, some or all of the software components may execute in memory on another device and communicate with the illustrated aerial vehicle control system 110. Some or all of the system components or data structures may also be stored (e.g., as instructions or structured data) on a non-transitory, computer-accessible medium or a portable article to be read by an appropriate drive, various examples of which are described above. In some implementations, instructions stored on a computer-accessible medium separate from the aerial vehicle control system 110 may be transmitted to the aerial vehicle control system 110 via transmission media or signals, such as electrical, electromagnetic, or digital signals, conveyed via a communication medium, such as a network and/or a wireless link. Various implementations may further include receiving, sending or storing instructions and/or data implemented in accordance with the foregoing description upon a computer-accessible medium. Accordingly, the techniques described herein may be practiced with other control system configurations.

Those skilled in the art will appreciate that, in some implementations, the functionality provided by the processes and systems discussed above may be provided in alternative ways, such as being split among more software modules or routines or consolidated into fewer modules or routines. Similarly, in some implementations, illustrated processes and systems may provide more or less functionality than is described, such as when other illustrated processes instead lack or include such functionality respectively, or when the amount of functionality that is provided is altered. In addition, while various operations may be illustrated as being performed in a particular manner (e.g., in serial or in parallel) and/or in a particular order, those skilled in the art will appreciate that, in other implementations, the operations may be performed in other orders and in other manners. Those skilled in the art will also appreciate that the data structures discussed above may be structured in different manners, such as by having a single data structure split into multiple data structures or by having multiple data structures consolidated into a single data structure. Similarly, in some implementations, illustrated data structures may store more or less information than is described, such as when other illustrated data structures instead lack or include such information respectively, or when the amount or types of information that is stored is altered. The various processes and systems as illustrated in the figures and described herein represent example implementations. The processes and systems may be implemented in software, hardware, or a combination thereof in other implementations. Similarly, the order of any process may be changed and various elements may be added, reordered, combined, omitted, modified, etc., in other implementations.

From the foregoing, it will be appreciated that, although specific implementations have been described herein for purposes of illustration, various modifications may be made without deviating from the spirit and scope of the appended claims and the features recited therein. In addition, while certain aspects are presented below in certain claim forms, the inventors contemplate the various aspects in any available claim form. For example, while only some aspects may currently be recited as being embodied in a computer readable storage medium, other aspects may likewise be so embodied. Various modifications and changes may be made as would be obvious to a person skilled in the art having the benefit of this disclosure. It is intended to embrace all such modifications and changes and, accordingly, the above description is to be regarded in an illustrative rather than a restrictive sense.

What is claimed is:

1. A battery monitoring system, comprising:
   a battery comprising a plurality of stacked cells;
   a housing configured to receive the battery, a first end of the battery being coupled to a mounting surface of the housing, and the housing including at least one reference marker associated with a second end of the battery opposite the first end;
   an imaging device configured to capture an image including the second end of the battery and the at least one reference marker; and
   a controller in communication with the imaging device, the controller configured to at least:
      instruct the imaging device to capture a first image including the second end of the battery and the at least one reference marker at a first time;
      determine a first position of the second end of the battery relative to the at least one reference marker based at least in part on the first image;
      instruct the imaging device to capture a second image including the second end of the battery and the at least one reference marker at a second time;
      determine a second position of the second end of the battery relative to the at least one reference marker based at least in part on the second image;
      determine a position difference between the first position and the second position; and
      calculate a state of charge of the battery based at least in part on the position difference.

2. The battery monitoring system of claim 1, further comprising:
   a temperature sensor configured to sense a temperature of the battery; and
   wherein the controller is further configured to at least:
      receive a first temperature of the battery from the temperature sensor at the first time;
      receive a second temperature of the battery from the temperature sensor at the second time; and
      determine a temperature difference between the first temperature and the second temperature; and
      wherein the state of charge of the battery is further calculated based at least in part on the temperature difference.

3. The battery monitoring system of claim 1, wherein the housing further includes a plurality of reference markers, each reference marker of the plurality of reference markers associated with a respective cell of the plurality of stacked cells of the battery.

4. The battery monitoring system of claim 3, wherein:
   the first image includes the plurality of stacked cells and the plurality of reference markers at the first time; and
   the second image includes the plurality of stacked cells and the plurality of reference markers at the second time; and
   wherein the controller is further configured to at least:
   determine respective first positions of each of the plurality of stacked cells relative to a respective reference marker of the plurality of reference markers based at least in part on the first image;
   determine respective second positions of each of the plurality of stacked cells relative to a respective reference marker of the plurality of reference markers based at least in part on the second image;
   determine respective position differences of each of the plurality of stacked cells between a respective first position and a respective second position; and
   calculate a respective state of charge of each of the plurality of stacked cells based at least in part on a respective position difference.

5. A monitoring apparatus, comprising:
   a power source comprising at least one electrochemical cell;
   a receptacle configured to receive the power source, the at least one electrochemical cell being coupled to the receptacle;
   an imaging device configured to capture an image of the at least one electrochemical cell; and
   a controller in communication with the imaging device, the controller configured to at least:
      instruct the imaging device to capture a first image of the at least one electrochemical cell at a first time;
      determine a first dimension of the at least one electrochemical cell based at least in part on the first image;
      instruct the imaging device to capture a second image of the at least one electrochemical cell at a second time;
      determine a second dimension of the at least one electrochemical cell based at least in part on the second image; and
      determine a change in dimension between the first dimension and the second dimension; and
      calculate at least one of a state of charge or a state of health of the power source based at least in part on the change in dimension.

6. The monitoring apparatus of claim 5, further comprising:
   a temperature sensor configured to sense a temperature of the power source; and
   wherein the controller is further configured to at least:

receive a first temperature of the at least one electrochemical cell from the temperature sensor at the first time; and receive a second temperature of the at least one electrochemical cell from the temperature sensor at a second time; and determine a temperature difference between the first temperature and the second temperature; and wherein the at least one of the state of charge or the state of health of the power source is further calculated based at least in part on the temperature difference.

7. The monitoring apparatus of claim 5, wherein the imaging device comprises a thermal imaging sensor; and wherein the controller is further configured to at least:

determine a first temperature of the at least one electrochemical cell based at least in part on thermal imaging data received from the thermal imaging sensor at the first time;

determine a second temperature of the at least one electrochemical cell based at least in part on thermal imaging data received from the thermal imaging sensor at the second time;

determine a temperature difference between the first temperature and the second temperature; and wherein the at least one of the state of charge or the state of health of the power source is further calculated based at least in part on the temperature difference.

8. The monitoring apparatus of claim 5, wherein at least a portion of the receptacle includes at least one reference marker, the at least the portion of the receptacle being made of a material having a thermal expansion coefficient similar to a thermal expansion coefficient of the power source; and wherein the first image captured by the imaging device at the first time includes the at least one electrochemical cell and the at least one reference marker.

9. The monitoring apparatus of claim 5, wherein the power source comprises a plurality of stacked electrochemical cells, and the receptacle includes a plurality of reference markers, each reference marker of the plurality of reference markers being associated with a respective electrochemical cell of the plurality of stacked electrochemical cells.

10. The monitoring apparatus of claim 9, wherein the power source is coupled to the receptacle at a coupling plane adjacent to the at least one electrochemical cell of the plurality of stacked electrochemical cells; and wherein a respective first dimension of each electrochemical cell of the plurality of stacked electrochemical cells is determined relative to the coupling plane and based at least in part on a respective reference marker.

11. The monitoring apparatus of claim 9, wherein the controller is further configured to at least:

determine respective first dimensions of each of the plurality of stacked electrochemical cells based at least in part on respective reference markers; and determine a respective state of health of at least one of the plurality of stacked electrochemical cells based at least in part on a comparison of the respective first dimensions of the plurality of stacked electrochemical cells.

12. The monitoring apparatus of claim 5, wherein the imaging device comprises a high resolution camera having a macro lens and a light source, the light source configured to emit at least one of visible light or infrared light.

13. A computer-implemented method, comprising:

instructing an imaging device to capture a first image of a power source at a first time, the power source comprising at least one electrochemical cell;

determining a first dimension of the at least one electrochemical cell based at least in part on the first image;

instructing the imaging device to capture a second image of the power source at a second time;

determining a second dimension of the at least one electrochemical cell based at least in part on the second image; and calculating at least one of a state of charge or a state of health of the at least one electrochemical cell based at least in part on a difference between the first dimension and the second dimension.

14. The computer-implemented method of claim 13, further comprising:

determining, using at least one of a temperature sensor or a thermal imaging sensor, a first temperature of the at least one electrochemical cell at the first time;

determining, using the at least one of the temperature sensor or the thermal imaging sensor, a second temperature of the at least one electrochemical cell at the second time; and wherein the at least one of the state of charge or the state of health of the at least one electrochemical cell is further calculated based at least in part on a difference between the first temperature and the second temperature.

15. The computer-implemented method of claim 13, wherein the imaging device is instructed to capture a plurality of images of the power source at a determined frequency during operation of the at least one electrochemical cell.

16. The computer-implemented method of claim 15, wherein the determined frequency is based at least in part on an expected operational duration of the at least one electrochemical cell.

17. The computer-implemented method of claim 15, wherein the determined frequency varies based at least in part on the at least one of the state of charge or the state of health of the at least one electrochemical cell.

* * * * *